US008993460B2

(12) United States Patent
LaVoie

(10) Patent No.: US 8,993,460 B2
(45) Date of Patent: Mar. 31, 2015

(54) APPARATUSES AND METHODS FOR DEPOSITING SIC/SICN FILMS VIA CROSS-METATHESIS REACTIONS WITH ORGANOMETALLIC CO-REACTANTS

(71) Applicant: Adrien LaVoie, Tualatin, OR (US)

(72) Inventor: Adrien LaVoie, Tualatin, OR (US)

(73) Assignee: Novellus Systems, Inc., Fremont, CA (US)

( * ) Notice: Subject to any disclaimer, the term of this patent is extended or adjusted under 35 U.S.C. 154(b) by 35 days.

(21) Appl. No.: 13/738,851

(22) Filed: Jan. 10, 2013

(65) Prior Publication Data

US 2014/0193983 A1   Jul. 10, 2014

(51) Int. Cl.
H01L 21/31   (2006.01)
H01L 21/02   (2006.01)
C23C 16/32   (2006.01)

(52) U.S. Cl.
CPC .......... *H01L 21/0226* (2013.01); *C23C 16/325* (2013.01); *H01L 21/02167* (2013.01); *H01L 21/02274* (2013.01); *H01L 21/0228* (2013.01)
USPC .......................................................... 438/786

(58) Field of Classification Search
CPC ....................... H01L 21/02167; C23C 16/325
See application file for complete search history.

(56) References Cited

U.S. PATENT DOCUMENTS

2008/0274281 A1\* 11/2008 Kobrin et al. .............. 427/255.7
2011/0195580 A1\* 8/2011 Okada et al. ................. 438/763
2011/0291284 A1\* 12/2011 Goldfarb et al. .............. 257/773
2012/0177841 A1\* 7/2012 Thompson .................... 427/535
2013/0224964 A1\* 8/2013 Fukazawa et al. ........... 438/765

OTHER PUBLICATIONS

Bansal et al., 'Alkylation of Si surfaces using a two-step halogenation/Grignard route,' 1996 J. Am. Chem. Soc. vol. 118 pp. 7225-7226.\*
Rueter et al., 'Surface reactions in the decomposition of zinc alkyls on Si(100)-2+1 surfaces,' 1991 Mat. Res. Soc. Symp. Proc. vol. 204 pp. 403-408.\*

\* cited by examiner

*Primary Examiner* — Fernando L Toledo
*Assistant Examiner* — Bryan Junge
(74) *Attorney, Agent, or Firm* — Weaver Austin Villeneuve & Sampson LLP

(57) ABSTRACT

Disclosed herein are methods of forming SiC/SiCN film layers on surfaces of semiconductor substrates. The methods may include introducing a silicon-containing film-precursor and an organometallic ligand transfer reagent into a processing chamber, adsorbing the silicon-containing film-precursor, the organometallic ligand transfer reagent, or both onto a surface of a semiconductor substrate under conditions whereby either or both form an adsorption-limited layer, and reacting the silicon-containing film-precursor with the organometallic ligand transfer reagent, after either or both have formed the adsorption-limited layer. The reaction results in the forming of the film layer. In some embodiments, a byproduct is also formed which contains substantially all of the metal of the organometallic ligand transfer reagent, and the methods may further include removing the byproduct from the processing chamber. Also disclosed herein are semiconductor processing apparatuses for forming SiC/SiCN film layers.

25 Claims, 4 Drawing Sheets

US 8,993,460 B2

APPARATUSES AND METHODS FOR DEPOSITING SIC/SICN FILMS VIA CROSS-METATHESIS REACTIONS WITH ORGANOMETALLIC CO-REACTANTS

BACKGROUND

Various thin film layers of semiconductor devices may be deposited with atomic layer deposition (ALD) processes. However, some ALD processes produce unwanted byproducts such as ammonium chloride. Some ALD processes are too time-consuming to deposit the desired film. This is oftentimes the case when forming films of silicon carbides and/or nitrogen containing silicon carbides, generally identified as SiC and SiCN, respectively. Some of these approaches employ long dosing times in order to ensure complete reaction of the film precursors on the wafer surface. However, extended dosing times may waste valuable precursor during film nucleation phases. Furthermore, the additive effect of extending processing time may diminish process tool throughput, requiring the installation and maintenance of additional process tools to support a production line. On the other hand, silicon carbide and nitride films produced by conventional approaches foregoing ALD processes may have physical, chemical, or electrical characteristics that provide inadequate device performance. Accordingly, potential improvements in the fabrication of integrated circuitry may be realized through the development of improved methods and apparatuses for depositing SiC and SiCN films, and particular depositing such films through improved ALD type processes.

SUMMARY OF THE DISCLOSURE

Disclosed herein are methods of forming SiC/SiCN film layers on surfaces of semiconductor substrates. The methods may include introducing a silicon-containing film-precursor and an organometallic ligand transfer reagent into a processing chamber, adsorbing the silicon-containing film-precursor, the organometallic ligand transfer reagent, or both onto a surface of a semiconductor substrate under conditions whereby either or both form an adsorption-limited layer, and reacting the silicon-containing film-precursor with the organometallic ligand transfer reagent, after either or both have formed the adsorption-limited layer. The reaction results in the forming of the film layer. In some embodiments, a byproduct is also formed which contains substantially all of the metal of the organometallic ligand transfer reagent, and the methods may further include removing the byproduct from the processing chamber. In some embodiments, the silicon-containing film-precursor forms the adsorption-limited layer prior to introducing the organometallic ligand transfer reagent into the processing chamber. In other embodiments, the organometallic ligand transfer reagent forms the adsorption-limited layer prior to introducing the silicon-containing film-precursor into the processing chamber. In some embodiments, the SiC/SiCN film layer is a conformal film layer, and in certain such embodiments, the surface of the substrate upon which the film is formed has patterned three-dimensional features.

In some embodiments, the metal of the organometallic ligand transfer reagent is selected from zinc, aluminum, and magnesium. In some embodiments, the organometallic ligand transfer reagent does not contain a halogen atom. In some embodiments, the organometallic ligand transfer reagent is a metal alkyl compound, and in certain such embodiments, the alkyl groups of the metal alkyl compound are selected from the methyl, ethyl, propyl, and t-butyl functional groups. In some embodiments, the organometallic ligand transfer reagent is a metal alkylamine compound.

In some embodiments, the silicon-containing film-precursor is a silane which does not contain a halogen atom. In some embodiments, the silane comprises an alkyl group selected from the methyl, ethyl, propyl, and t-butyl functional groups, and in some embodiments, the silane comprises two alkyl groups selected from the methyl, ethyl, propyl, and t-butyl functional groups. In some embodiments, the silane is selected from methylsilane, ethylsilane, isopropylsilane, t-butylsilane, dimethylsilane, trimethylsilane, diethylsilane, di-t-butylsilane, allylsilane, sec-butylsilane, thexylsilane, isoamylsilane, t-butyldisilane, and di-t-butyldisilane. In some embodiments, the silane comprises a first amine group, and in certain such embodiments, the first amine group is substituted with a first alkyl group. In some embodiments, the silane further comprises a second amine group substituted with a second alkyl group. Depending on the embodiments, the first alkyl group may be selected from the methyl, ethyl, propyl, and t-butyl functional groups, and the second alkyl group may be selected from the methyl, ethyl, propyl, and t-butyl functional groups. In some embodiments, the silane is selected from mono-aminosilane, di-aminosilane, tri-aminosilane, tetra-aminosilane, t-butylaminosilane, methylaminosilane, t-butylsilanamine, n-tert-butyltrimethylsilylamine, t-butyl silylcarbamate, $SiHCH_3(N(CH_3)_2)_2$, $SiH(N(CH_3)_2)_3$, $SiHCl(N(CH_3)_2)_2$, $Si(CH_3)_2(NH_2)_2$, $N(SiH_3)_3$, and $(NR)_2Si(CH_3)_2$ where R is selected from H, Me, Et, i-Pr, n-Pr, and t-butyl.

Also disclosed herein are semiconductor processing apparatuses for forming SiC/SiCN film layers on surfaces of semiconductor substrates. In some embodiments, the apparatuses may include a processing chamber having a substrate holder within the chamber, a reactant delivery system fluidically connected to the processing chamber, one or more vacuum pumps, one or more gas outlets fluidically connecting the processing chamber to the one or more vacuum pumps, and a system controller comprising machine readable code. Depending on the embodiment, the machine readable code may include instructions for operating the reactant delivery system to introduce a silicon-containing film-precursor into the processing chamber so that the silicon-containing film-precursor adsorbs onto a surface of the substrate under conditions whereby the silicon-containing film-precursor forms an adsorption-limited layer. The machine readable code may further include instructions for operating the reactant delivery system to introduce an organometallic ligand transfer reagent into the processing chamber so that the organometallic ligand transfer reagent reacts with the adsorbed silicon-containing film-precursor to form a film layer and a byproduct which contains substantially all of the metal of the ligand transfer reagent. In some embodiments, the machine readable code may further include instructions for operating the one or more gas outlets to evacuate the byproduct from the processing chamber.

DETAILED DESCRIPTION

Figure 1:
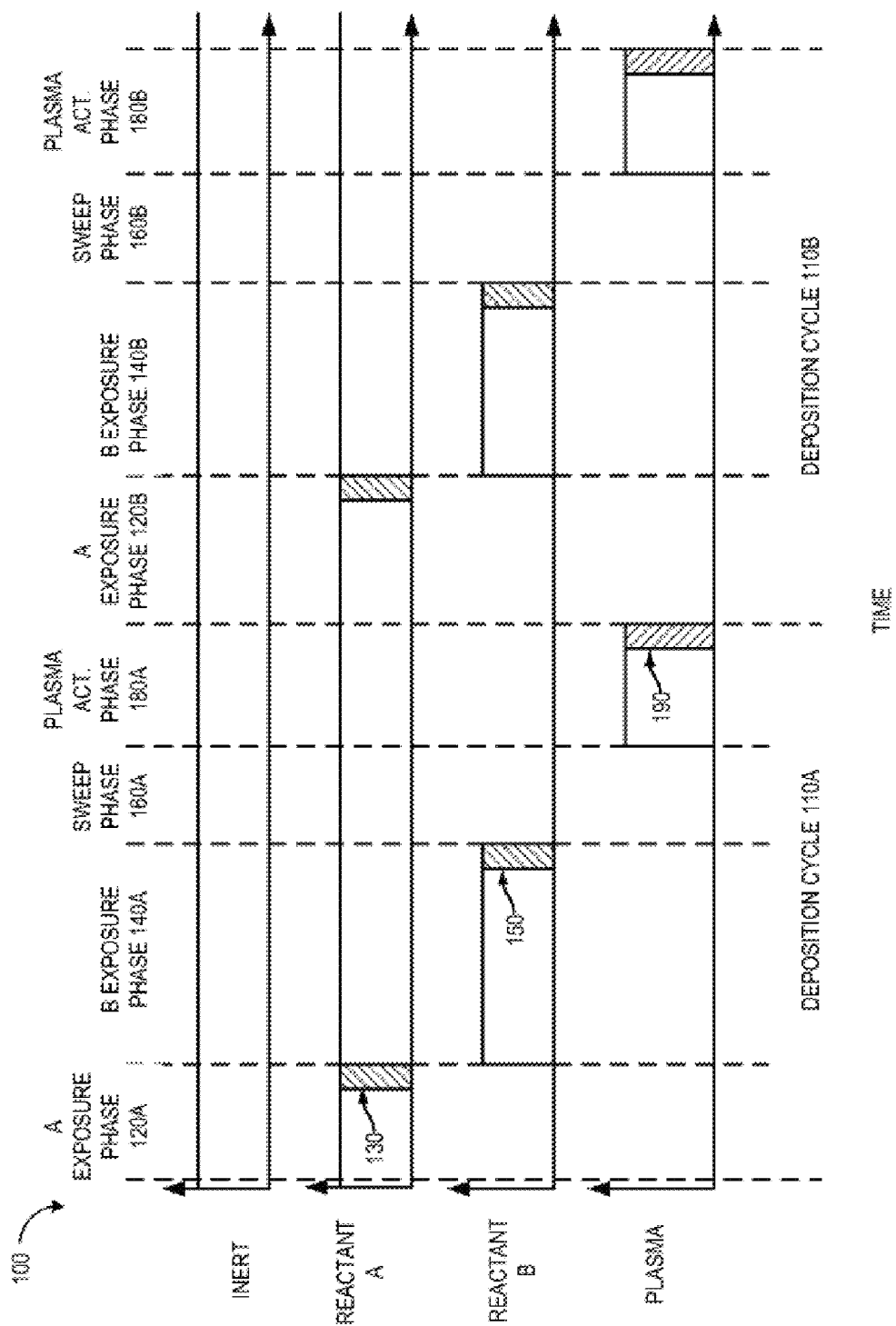
FIG. 1 schematically illustrates a process sequence for depositing film layers via atomic layer deposition (ALD).

In general, a chemical reaction may be referred to as a metathesis reaction, or exchange reaction, or double replacement reaction if it is of the type:

$$A\text{-}B + C\text{-}D \rightarrow A\text{-}D + C\text{—}B \quad (Eq. 1),$$

wherein parts of two reacting chemical species swap places. A concrete example, for instance is

$$AgNO_3 + HCl \rightarrow HNO_3 + AgCl \quad (Eq. 2),$$

wherein after the reaction, the Cl functional group has swapped places with the $NO_3$ functional group originally attached to the Ag atom. In some cases, these sorts of chemical reactions—involving the swapping of bonding partners—may be useful for depositing films in semiconductor device fabrication. One such application is to the deposition of SiC and/or SiCN films. In some cases, films of SiC and/or SiCN deposited via metathesis reactions are capable of meeting step-coverage, fill, defect, reliability, and electrical requirements for the nominal 1X nm memory and 16/12 nm generation logic nodes. In some cases, these films may be advantageously deposited at temperatures of under 400° C., which is important to a deposition process not thermally taxing a semiconductor substrate beyond its thermal budget limits.

While there are methods of depositing SiC and SiCN films other than those which are the focus of this application, these approaches have been typically accompanied by various problems and challenges. For instance, conformal film deposition (CFD) of SiCN via the reaction of dichlorosilane and ammonia suffers from the formation of an ammonium chloride byproduct. This salt has a high decomposition temperature and may lead to severe process chamber and exhaust line contamination. Films of SiCN may also be formed through CFD via the reaction of dichlorosilane and t-butylamine. However, this method is not cost-effective due to the necessity of overdosing with expensive t-butylamine precursor, and also due to limited wafer throughput resulting from the time-consuming nature of this reaction—a throughput of 8-10 wafers/hour is typical for depositing 100 Å thick SiCN films. Moreover, the dichlorosilane precursor is a halide compound which may be corrosive to various components of a substrate processing apparatus, and since this deposition process operates at 475° C., it typically exceeds the normal thermal budget for BEOL processing. Another option is to react t-butylamine with trisilylamine, instead of using a potentially corrosive halide compound, however, once again, t-butylamine is expensive, and the problem of poor throughput times remains.

The high-temperature conditions required by the foregoing reactions, as well as their low throughput, provides an indication that formation of SiC and SiCN films via these processes is kinetically disfavored. Thus, while the thermodynamics of these reactions does, in a technical sense, drive film formation, the driving force is perhaps slight and not substantial enough to overcome unfavorable kinetic factors—e.g. a transition state between reactants and products having a large activation energy relative to these thermodynamic driving forces. Accordingly, what is sought is a reaction mechanism which provides lower energy of activation thresholds and more favorable kinetics.

One possible route to kinetically-feasible film-forming deposition reactions is through the use of an unstable, or at least only moderately-stable, carbon-transfer agent. Gringard reagents represent one such class of carbon-transfer agents, that so happen to involve a magnesium metal center. Other unstable/moderately-stable carbon-transfer agents are also available, however. Examples include carbon-transfer agents based upon aluminum or zinc metal centers as will be described in detail below. Such carbon-transfer agents may react with a silicon-containing film-precursor to form films of SiC, or SiCN, or mixtures of both SiC and SiCN in a much more kinetically favorable silicon alkylating process than those described above. Moreover, in some embodiments, these synthetic methods utilize reactants which are (1) inexpensive and readily available, (2) volatile at temperatures of 400° C. or less and hence amenable to delivery and deposition via chemical vapor deposition (CVD) or atomic layer deposition (ALD), and (3) halogen-free, eliminating concerns about the corrosiveness and toxicity of halogenated reactants and/or reaction byproducts (ammonium chloride, for example).

Accordingly, disclosed herein are methods and apparatuses for depositing SiC and SiCN films employing metathesis reactions between various film precursors. In some embodiments, a silicon-containing precursor is reacted with an organometallic ligand transfer reagent to form the silicon-containing film. Examples of ligands that may be transferred via the organometallic ligand transfer reagent include ligands having one or more alkyl, phenyl, amine, amide, and/or halide functional groups, or combinations thereof. In certain such embodiments, a film of SiC or SiCN or a film having substantial amounts of both is formed via the reaction of a silicon-containing precursor with either trimethylaluminum or diethylzinc.

Moreover, different types of deposition processes may be used to form SiC and SiCN films through metathesis reactions. In some embodiments, films may be deposited by chemical vapor deposition (CVD) wherein the metathesis reaction occurs in the gas phase. However, in some embodiments, the metathesis reaction may be a surface-mediated reaction which occurs after at least one of the film precursors has been adsorbed onto the surface of the substrate. For instance, the atomic layer deposition (ALD) processes described in the next section of this disclosure may be employed to deposit SiC and SiCN films. In some embodiments, such an ALD process may involve the adsorption of a silicon-containing film precursor onto a substrate surface under conditions whereby the silicon-containing film precursor forms an adsorption-limited layer, and then subsequently reacting the adsorbed silicon-containing film precursor with an organometallic ligand transfer reagent in order to form a SiC and/or SiCN film layer. In some embodiments, a SiC and/or SiCN film layer formed as such is a conformal film layer which may be used, for instance, to overlie a surface of a semiconductor substrate having patterned three-dimensional features. Some such film-forming reactions will also result in the formation of a byproduct which contains substantially all of the metal atoms originally provided to the processing chamber by the organometallic ligand transfer reagent. In some cases, it is advantageous to subsequently remove the by-product from the processing chamber.

Atomic Layer Deposition Processes and Apparatuses

Manufacture of semiconductor devices typically involves depositing one or more thin films on a non-planar substrate in an integrated fabrication process. In some aspects of the integrated process it may be useful to deposit thin films that conform to substrate topography. For example, a SiC/SiCN film may be deposited on top of an elevated gate stack to act as a spacer layer for protecting lightly-doped source and drain regions from subsequent ion implantation processes.

In spacer layer deposition processes, chemical vapor deposition (CVD) may be used to form a silicon nitride film on the non-planar substrate, which is then anisotropically etched to form the spacer structure. However, as the distance between gate stacks decreases, mass transport limitations of CVD gas phase reactions may cause "bread-loafing" deposition effects. Such effects typically exhibit thicker deposition at top surfaces of gate stacks and thinner deposition at the bottom corners of gate stacks. Further, because some die may have regions of differing device density, mass transport effects across the wafer surface may result in within-die and within-wafer film thickness variation. These thickness variations may result in over-etching of some regions and under-etching of other regions. This may degrade device performance and/or die yield.

Some approaches to addressing these issues involve atomic layer deposition (ALD). In contrast with a CVD process, where thermally activated gas phase reactions are used to deposit films, ALD processes use surface-mediated deposition reactions which deposit films on a layer-by-layer basis. In one example ALD process, a substrate surface, including a population of surface active sites, is exposed to a gas phase distribution of a first film precursor (P1), such as a silicon-containing film precursor. Some molecules of P1 may form a condensed phase atop the substrate surface, including chemisorbed species and physisorbed molecules of P1. The reaction chamber is then evacuated to remove gas phase and physisorbed P1 so that only chemisorbed species remain. A second film precursor (P2), such as an organometallic ligand transfer reagent, for example, is then introduced to the processing chamber so that some molecules of P2 adsorb to the substrate surface. The processing chamber may again be evacuated, this time to remove unbound P2. Subsequently, thermal energy, or in some embodiments, energy from a plasma, is provided to the substrate in order to activate surface reactions between adsorbed molecules of P1 and P2, forming a film layer. After the film-forming reaction, to complete the ALD cycle, the processing chamber may be evacuated to remove reaction byproducts, such as byproducts which may contain the metal atoms of the organometallic ligand transfer reagent, and possibly to remove unreacted P1 and P2. Additional ALD cycles may be included to build film thickness. Note that in some embodiments, P2 may react with adsorbed P1 without being itself adsorbed onto the substrate surface. Such a reaction may still be surface-mediated, and considered to be adsorption-limited, due to the adsorption of P1, and the fact that the reaction will P2 occurs on the substrate surface or, at least, in close proximity to the substrate surface. For example, in some embodiments, a silicon-containing film precursor may be adsorbed onto the surface of a substrate, unadsorbed precursor may be removed from the processing chamber, and an organometallic ligand transfer reagent may be introduced into the processing chamber to react with the adsorbed silicon-containing film precursor without the ligand transfer reagent being first adsorbed onto the substrate surface. In some embodiments, the ligand transfer reagent may be introduced first, adsorbed onto the substrate surface, and after unadsorbed ligand transfer reagent is removed from the processing chamber, a silicon-containing film precursor may be introduced and reacted with the adsorbed ligand transfer reagent, without the silicon-containing film precursor being, strictly-speaking, adsorbed onto the substrate surface prior to the reaction. However, it should be noted that irrespective of which reactive species forms the adsorption limited layer (or even if more than one), the presence of some leftover unadsorbed quantity of the same species, if not removed from the processing chamber, will oftentimes result in a certain amount of parasitic CVD-type process contributing toward film formation. Technically, such a process might be referred to as a hybrid ALD/CVD process—that is, if the parasitic CVD-type component represents a meaningful fraction of the sum total of all film forming chemical reactions occurring in the processing chamber. Nevertheless, in the present disclosure, phrases such as "ALD process," "ALD-type reactive process," "ALD film-forming reaction/process," and the like are assumed to refer to purely ALD processes as well as deposition processes that may be described as primarily ALD plus a parasitic CVD component (or, for that matter, ALD plus any other type of secondary deposition process which occurs to a lesser extent than the primary ALD process).

Depending on the exposure time of the precursor dosing steps and the sticking coefficients of the precursors, each ALD cycle may deposit a film layer having a thickness, for example, of between about ½ and 3 Å. Thus, ALD processes may be time consuming when depositing films more than a few nanometers thick. Furthermore, some precursors may require long exposure times in order to deposit an adequate conformal film, which may also increase substrate throughput time.

Conformal films may also be deposited on planar substrates. For example, antireflective layers for lithographic patterning applications may be formed from planar stacks comprising alternating film types. Such antireflective layers may be approximately 100 to 1000 Å thick, making ALD processes less attractive than CVD processes. However, such anti-reflective layers may also have a lower tolerance for within-wafer thickness variation than many CVD processes are able to provide. For example, a 600 Å thick antireflective layer may tolerate a thickness variation of less than 3 Å.

Accordingly, various processes and apparatuses are disclosed herein for forming SiC/SiCN films via atomic layer deposition (ALD) on non-planar, or planar substrates, or both. In some embodiments, ALD processes and/or apparatuses may employ a plasma-activation step, whereas in other embodiments, plasma-activation may not be necessary for the film-forming reaction to proceed. Likewise, a variety of other possible features may or may not be employed in a particular ALD process and/or apparatus used for depositing SiC/SiCN films, depending on the embodiment. Among these features are (1) eliminating or reducing the time required to "sweep" one or both film-precursors/reactants from the processing chamber, (2) providing a continuous flow of at least one film-precursor/reactant while a different film-precursor/reactant is intermittently flowed into the processing chamber, (3) igniting plasma while one of the film-precursors/reactants is present in the gas phase, rather than when all film-precursors/reactants are cleared from the processing chamber, (4) treating deposited ALD films with a plasma to modify the properties of the films, (5) depositing a portion of a film by plasma-enhanced chemical vapor deposition (PECVD) after depositing a first portion of the film by ALD, typically in the same processing chamber, (6) etching a partially deposited film between ALD stages or cycles, and (7) doping the ALD film by interspersing dopant delivery cycles with film-only deposition cycles. Of course, this list is not exhaustive, and various other possible ALD features will be apparent from various portions of this disclosure.

Before delving into the foregoing 7 ALD features in greater depth, it is useful to review and understand the concept of an ALD "cycle." Generally a single ALD cycle is the minimum set of operations required to perform a substrate surface deposition reaction one time. The result of one ALD cycle is the production of at least a partial film layer on the substrate surface. Typically, an ALD cycle will include only those steps necessary to deliver and adsorb one or more reactants to the substrate surface, and then to react the adsorbed reactant(s) to form at least a partial layer of film. Of course, an ALD cycle may include certain ancillary steps such as sweeping one or more of the reactants or byproducts from the processing chamber, a post-deposition treatment of the as-deposited film (or partial film), etc. Generally, an ALD cycle contains only one instance of a unique sequence of operations. As an example, a cycle may include the following operations: (i) delivery/adsorption of film-precursor/reactant A, (ii) delivery/adsorption of film-precursor/reactant B, (iii) sweep B out of the processing chamber, and (iv) apply plasma or thermal energy to drive the surface reaction of A and B to form at least a partial film layer on the surface.

The 7 above-mentioned features will now be discussed in further detail. In what follows, an ALD reaction is to be considered as one in which a film (or partial film) is formed on a substrate surface after a film-precursor/reactant is adsorbed onto the surface and reacted with another film-precursor/reactant which may or may not be adsorbed prior to initiation of the reaction. Depending on the embodiment, a plasma may or may not be used to initiate and/or drive the aforementioned surface-mediated reaction. In some embodiment, the ALD film-forming reaction may be thermally driven.

Feature 1 (Continuous Flow of a Reactant):

Reactant A continues to flow to a processing chamber during one or more portions of an ALD cycle when the reactant would not normally flow in basic ALD. In basic ALD, reactant A flows only for the purpose of having the reactant adsorb onto the substrate surface. At other phases of an ALD cycle, reactant A does not flow. In accordance with certain ALD embodiments described herein, however, reactant A flows not only during phases associated with its adsorption but also during phases of an ALD cycle that perform operations other than adsorption of A. For example, in many embodiments, reactant A flows into the processing chamber while the apparatus is dosing a second reactant (reactant B herein). Thus, during at least a portion of an ALD cycle, reactants A and B coexist in the gas phase. Further, reactant A may flow while plasma is applied to drive a reaction at the substrate surface. Note that the continuously flowing reactant may be delivered to the reaction chamber in conjunction with a carrier gas—e.g., argon, nitrogen, etc. One advantage of the continuous flow embodiment is that the established flow avoids the delays and flow variations caused by transient initialization and stabilization of flow associated with turning the flow on and off.

As a specific example, an oxide film may be deposited by an ALD process using a principal reactant (a reactant which is adsorbed onto the substrate surface, sometimes referred to as a "solid component" precursor or, in this example, simply "reactant B") such as bis(tert-butylamino)silane (BTBAS). In this example, the oxide deposition process involves delivery of an oxidant such as oxygen or nitrous oxide, which flows initially and continuously during delivery of the principal reactant in distinct exposure phases. The oxidant also continues to flow during distinct plasma exposure phases. See, for example, the sequence depicted in FIG. 1. For comparison, in a basic ALD process, the flow of oxidant would stop during delivery of the principle reactant to the processing chamber. For example, the flow of reactant A would stop when reactant B is delivered.

In some specific examples, the reactant that flows continuously is an "auxiliary" reactant. As used herein, an "auxiliary" reactant is any reactant that is not a "principal" reactant. As suggested above, a principal reactant may contain an element that is solid at room temperature, which element is contributed to the film formed by ALD. Examples of such elements are metals (e.g., aluminum and titanium), semiconductors (e.g., silicon and germanium), and non-metals or metalloids (e.g., boron). Examples of auxiliary reactants include oxygen, ozone, hydrogen, carbon monoxide, nitrous oxide, ammonia, alkyl amines, and the like.

The continuously flowing reactant may be provided at a constant flow rate or at a varied but controlled flow rate. In the latter case, as an example, the flow rate of an auxiliary reactant may drop during an exposure phase when the primary reactant is delivered. For example, in oxide deposition, the oxidant (e.g., oxygen or nitrous oxide) may flow continuously during the entire deposition sequence, but its flow rate may drop when the primary reactant (e.g., BTBAS) is delivered. This increases the partial pressure of BTBAS during its dosing, thereby reducing the exposure time needed to saturate the substrate surface. Shortly before igniting the plasma, the flow of oxidant may be increased to reduce the likelihood that BTBAS is present during the plasma exposure phase. In some embodiments, the continuously flowing reactant flows at a varied flow rate over the course of two or more deposition cycles. For example, the reactant may flow at a first flow rate during a first ALD cycle and at a second flow rate during a second ALD cycle.

When multiple reactants are employed and the flow of one of them is continuous, at least two of them will co-exist in the gas phase during a portion of the ALD cycle. Similarly, when no purge step is performed after delivery of the first reactant, two reactants will co-exist. Therefore, it may be important to employ reactants that do not appreciably react with one another in the gas phase absent application of activation energy. Typically, the reactants should not react until present on the substrate surface and exposed to either a plasma or some another appropriate activation condition or method for initiating the surface-mediated reaction. Choosing such reactants involves considerations of at least (1) the thermodynamic favorability (Gibb's free energy<0) of the desired reaction, and (2) the activation energy for the reaction, which should be sufficiently great so that there is negligible reaction at the desired deposition temperature.

Feature 2 (Reduce or Eliminate a Sweep Step):

In certain embodiments, the process dispenses with or reduces the time associated with a sweep step that would normally be performed in basic ALD. In basic ALD, a separate sweep step is performed after each reactant is delivered and adsorbed onto the substrate surface. Little or no adsorption or reaction occurs in a basic ALD sweep step. However, in some embodiments, an ALD cycle may employ a reduced sweep step or eliminate the sweep step after delivery of one or more reactants. An example of an ALD process sequence in which a sweep step is removed is presented in FIG. 1. No sweep step is performed to sweep reactant A from the reaction chamber. In some cases, no sweep step is performed after delivery of the first reactant in an ALD cycle but a sweep step is optionally performed after delivery of the second or last delivered reactant.

The concept of an ALD "sweep" step or phase appears herein in the disclosure relating to various embodiments.

Generally, a sweep step or phase removes or purges one of the vapor phase reactants from a reaction chamber and typically occurs only after delivery of such reactant is completed. In other words, that reactant is no longer delivered to the reaction chamber during the sweep phase. However, the reactant remains adsorbed on the substrate surface during the sweep phase. Typically, the sweep serves to remove any residual vapor phase reactant in the chamber after the reactant is adsorbed on the substrate surface to the desired level. A sweep step or phase may also remove weakly adsorbed species (e.g., certain precursor ligands or reaction byproducts) from the substrate surface. In basic ALD, the sweep phase is used to prevent gas phase interaction of two reactants or interaction of one reactant with a thermal, plasma or other driving force for the surface reaction. In general, and unless otherwise specified herein, a sweep phase may be accomplished by (i) evacuating a reaction chamber, and/or (ii) flowing gas not containing the species to be swept out through the reaction chamber. In the case of (ii), such a gas may be, for example, an inert gas or an auxiliary reactant such as a continuously flowing auxiliary reactant.

Elimination of the sweep phase may be accomplished with or without continuous flow of the other reactant. In the embodiment depicted in FIG. 1, reactant A is not swept away but rather continues to flow after its adsorption onto the substrate surface is completed (illustrated by reference number 130 in the figure).

In various embodiments where two or more reactants are employed, the reactant which has its sweep step eliminated or reduced is an auxiliary reactant. As an example, an auxiliary reactant may be an oxidant, or a nitrogen source, or a carbon source, or a nitrogen and carbon source such as a compound containing one or more alkyl amine functional groups (as described in more detail below). In some embodiments, a primary reactant may be a silicon containing film-precursor. Of course, a sweep of the principal reactant may also be reduced or eliminated. In some examples, no sweep step is performed after delivery of an auxiliary reactant but a sweep step is optionally performed after delivery of a principal reactant.

As mentioned, the sweep phase need not be fully eliminated but simply reduced in duration in comparison to sweep phases in basic ALD processes. For example, the sweep phase of a reactant such as an auxiliary reactant during certain embodiment ALD cycles may be performed for about 0.2 seconds or less, e.g., for about 0.001 to 0.1 seconds.

Feature 3 (Igniting Plasma while One of the Reactants is Present in the Gas Phase):

With this feature, a plasma is ignited before all reactants have been cleared from the processing chamber. This is contrary to what occurs in a basic ALD process, where the plasma activation or other reaction driving operation is provided only after the vapor phase reactants are no longer present in the processing chamber. Note that this feature would necessarily occur when reactant A flows continuously during the plasma portion of an ALD cycle as depicted in FIG. 1. However, the disclosed embodiments are not limited in this manner. One or more reactants may flow during the plasma phase of an ALD cycle but need not flow continuously during an ALD cycle. Further, the reactant present in vapor phase during plasma activation may be a principal reactant or an auxiliary reactant (when two more reactants are employed in an ALD cycle).

For example, a sequence might be (i) introduce reactant A, (ii) purge A, (iii) introduce reactant B and while B is flowing strike a plasma, and (iv) purge. In such embodiments, the process employs a plasma activated reactant species from the gas phase. This is a general example where ALD is not constrained to a sequence of sequential steps.

If activation plasma is provided at a time during which the species for forming the adsorption-limited layer (a primary reactant) is supplied to the processing chamber, the resulting step coverage may become less conformal, but the film's deposition rate will typically increase. However, if plasma activation occurs only during delivery of species which are not used for forming the adsorption-limited layer (an auxiliary reactant) a loss of conformality may not occur. The plasma can activate the vapor phase auxiliary component to render it more reactive and thereby increase its reactivity in the conformal film deposition reaction. In certain embodiments, this feature is employed when depositing a silicon-containing film such as an oxide, nitride, or carbide. Of course, in certain embodiments, there is no plasma activation step required. For instance, in the formation of SiC/SiCN films employing a ligand transfer reagent and a silicon-containing precursor, deposition may be accomplished without plasma activation. Post-deposition plasma treatment of the deposited SiC/SiCN films, however, may improve the physical properties of the films and may also provide other advantages. See, e.g., Feature 4 which follows.

Feature 4 (Plasma Treatment of Deposited ALD Films):

In these embodiments, the plasma may serve an alternative role in the atomic layer deposition process—a role other than to activate or drive the film formation reaction during each ALD cycle. The alternative role is post-deposition plasma treatment of the ALD-formed films. Note, however, that depending on the embodiment, the post-dep qualifier merely indicates that a plasma is used to treat whatever portion of the film has already been deposited. For instance, post-deposition plasma treatments may be interspersed between two or more ALD cycles. Plasma treatments may be used to modify one or more film properties. For films whose deposition involves a plasma-activation step, the plasma used for post-deposition plasma treatment is typically different, or formed under different conditions, or employed under different conditions than the plasma used for activation, though this is not necessarily the case. As an example, a post-deposition plasma treatment may be performed in the presence of a reducing or oxidizing environment (e.g., in the presence of hydrogen or oxygen), while this is not necessarily the case during the plasma activation of the ALD reaction.

The plasma treatment operation may be performed between every cycle of the ALD process, between every other cycle, or on some less frequent basis. If the plasma treatment is performed after each ALD cycle, it may be considered to be a part of the ALD cycle—as long as the distinction between plasma activation and plasma treatment is understood when employing such nomenclature. The plasma treatment may be performed on regular intervals, tied to a fixed number of ALD cycles, or it may be performed variably (e.g., at varying intervals of ALD cycles), or even randomly. In a typical example, film deposition is performed for a few ALD cycles, to reach appropriate film thickness, and then the plasma treatment is employed. Thereafter, film deposition is again performed for a number of ALD cycles without plasma treatment before the treatment is again performed. This super-sequence of x number of ALD cycles, followed by plasma treatment (film modification) may be repeated until the film is completely formed by ALD.

In certain embodiments, the plasma treatment may be performed before initiation of ALD cycling to modify one or more properties of the surface on which the ALD film is deposited. In various embodiments, the surface is made from silicon (doped or undoped) or a silicon-containing material.

The modified surface may be better able to produce a high quality interface with the subsequently deposited ALD film. The interface may provide, e.g., good adhesion, reliable electrical properties through, e.g., defect reduction, etc.

The pretreatment of the substrate prior to ALD is not limited to any particular plasma treatment. In certain embodiments, the pre-treatment involves exposure to hydrogen-plasma, nitrogen-plasma, nitrogen/hydrogen-plasma, ammonia-plasma, argon-plasma, helium-plasma, helium anneal, hydrogen-anneal, ammonia-anneal, and UV-cure in the presence of helium, hydrogen, argon, nitrogen, hydrogen/nitrogen-forming gas, and/or ammonia. Plasma processing may be enabled with various plasma generators including, though not limited to, microwave, ICP-remote, direct and others known to those in the art.

Overall, the treatment may occur before, during, and/or after ALD cycling. When occurring during ALD cycling, the frequency of treatment may be chosen for the appropriate deposition conditions. Typically, the treatment will occur not more often than once per cycle.

The plasma conditions employed to modify the film surface may be chosen to effect a desired change in film properties and/or composition. Among the plasma conditions that can be selected and/or tailored for the desired modification are oxidizing conditions, reducing conditions, etching conditions, power used to generate the plasma, frequency used to generate the plasma, use of two or more frequencies to generate the plasma, plasma density, the distance between the plasma and the substrate, etc. Examples of ALD film properties that can be modified by plasma treatment include, internal film stress, etch resistance, density, hardness, optical properties (refractive index, reflectivity, optical density, etc.), dielectric constant, carbon content, electrical properties (Vfb spread, etc.), and the like.

For example, ALD formation of SiC/SiCN films via the reaction of a organometallic ligand transfer reagent with a silicon-containing precursor generally does not require plasma mediation/activation. In many cases, these reactions may be thermally driven. Nevertheless, plasmas may be used to modify the physical, chemical, and/or electrical properties of the as-deposited films. In some embodiments, an ALD film of SiC and/or SiCN may be densified via plasma treatment. Densifying these films may be advantageous because through the compression and packing of the film molecules together, defects and voids which adversely affect the electrical properties of the deposited films may be, at least partially, eliminated. In some embodiments, the SiC/SiCN stoichiometry of the as-deposited film may be tuned with a nitrogen or amine plasma. In some embodiments, the electrical properties of a SiC/SiCN film formed via ALD may be modified. Plasma treatment of an ALD SiC/SiCN film (for example, to densify it) may be performed after the entire film has been deposited, or plasma treatments may be interspersed between ALD cycles, such as after each ALD cycle, after every 2 ALD cycles, after every 3 ALD cycles, after every 5 ALD cycles, after every 10 ALD cycles, etc. In some embodiments, plasma treatments may be performed after some number of ALD cycles within a certain range have been performed, such as performing a plasma treatment after every 5 to 10 ALD cycles have been performed, or after every 2 to 3 ALD cycles have been performed. In some embodiments, a plasma treatment may be interspersed between ALD cycles after a prior sequence of ALD cycles have deposited a SiC/SiCN film of a certain minimum thickness, for instance, after the previous sequence of ALD cycles deposits at least about 1 Å of SiC/SiCN film, or at least about 2 Å, or 3, or 4, or 5, or 10, or 25, or 50, or 100, or at least about 200 Å of SiC/SiCN film. In some embodiments, a plasma treatment may be interspersed between ALD cycles after the prior sequence of ALD cycles deposits a SiC/SiCN film having a thickness within a range of thicknesses defined by any two of the aforementioned minimum thicknesses such as, for example, a range of thicknesses between about 5 Å and about 25 Å, or a range of thicknesses between about 50 Å and about 200 Å.

In some embodiments, a treatment other than a plasma treatment is employed to modify the properties of the as-deposited film. Such treatments include electromagnetic radiation treatments, thermal treatments (e.g., anneals or high temperature pulses), and the like. Any of these treatments may be performed alone or in combination with another treatment, including a plasma treatment. Any such treatment can be employed as a substitute for any of the above-described plasma treatments. In a specific embodiment, the treatment involves exposing the film to ultraviolet radiation. As described below, in a specific embodiment, the method involves application of UV-radiation to an ALD film in situ (i.e., while it is being formed via ALD). Such a treatment may reduce or eliminate defect structure and provide improved electrical performance.

In certain specific embodiments, a UV treatment can be coupled with a plasma treatment. These two operations can be performed concurrently or sequentially. In the sequential option, the UV operation optionally takes place first. In the concurrent option, the two treatments may be provided from separate sources (e.g., an RF power source for the plasma and a lamp for the UV) or from a single source such as a helium plasma that produces UV radiation as a byproduct.

Feature 5 (Depositing by ALD and then Transitioning to PECVD):

In such embodiments, the completed film is generated in part by ALD and in part by a CVD process such as PECVD. Typically, the ALD portion of the deposition process if performed first and the PECVD portion is performed second, although this need not be the case. Mixed ALD/CVD processes can improve the step coverage over that seen with CVD alone and additionally improve the deposition rate over that seen with ALD alone. In some cases, plasma or other activation is applied while one ALD reactant is flowing in order to produce parasitic CVD operations and thereby achieve higher deposition rates, a different class of films, etc.

In certain embodiments, two or more ALD phases may be employed and/or two or more CVD phases may be employed. For example, an initial portion of the film may be deposited by ALD, followed by an intermediate portion of the film being deposited by CVD, and a final portion of the film deposited by ALD. In such embodiments, it may be desirable to modify the CVD portion of the film, as by plasma treatment or etching, prior to depositing the later portion of the film by ALD.

A transition phase may be employed between the ALD and CVD phases. The conditions employed during such a transition phase may differ from those employed in either the ALD or the CVD phases. Typically, though not necessarily, the conditions permit simultaneous ALD surface reactions and CVD type gas phase reaction. The transition phase typically involves exposure to a plasma, which may be pulsed, for example. Further, the transition phase may involve delivery of one or more reactants at a low flow rate, i.e., a rate that is significantly lower than that employed in the corresponding ALD phase of the process.

Feature 6 (Deposit by ALD, Etch, and then Further Deposit by ALD):

In such embodiments, ALD deposition is performed for one or more cycles (typically a number of cycles) and then the resulting film is etched to remove, for example, some excess film at or near a recess entrance (a cusp), followed by further cycles of ALD deposition. Other examples of structural features in the deposited film that may be etched in a similar manner. The etchant chosen for this process will depend on the material to be etched. In some cases, the etch operation may be performed with a fluorine containing etchant (e.g., $NF_3$) or hydrogen.

In certain embodiments, a remote plasma is employed to produce the etchant. Generally, a remote plasma etches in a more isotropic fashion than a direct plasma. A remote plasma generally provides a relatively high fraction of radicals to the substrate. The reactivity of these radicals may vary with the vertical position within the recess. At the top of the feature, the radicals are more concentrated and consequently will etch at a higher rate, while further down the recess and at the bottom, some radicals will have been lost and therefore they will etch at a lower rate. This is of course a desirable reactivity profile for addressing the problem of too much deposition occurring at the recess opening. An additional benefit of using a remote plasma in etching is that the plasma is relatively gentle and hence unlikely to damage the substrate layer. This can be particularly beneficial when the underlying substrate layer is sensitive to oxidation or other damage.

Feature 7 (Tailoring the Film Composition with Additional Reactant):

Many of the examples presented herein concern ALD processes employing one or two reactants. Further, many of the examples employ the same reactants in every ALD cycle. However, this need not be the case. First, many ALD processes may employ three or more reactants. Examples include (i) ALD of tungsten using as reactants diborane, tungsten hexafluoride, and hydrogen, and (ii) ALD of silicon oxide using as reactants diborane, BTBAS, and oxygen. The diborane can be removed from the growing film or it can be incorporated into the film if appropriate.

Further, some examples may employ additional reactants in only some ALD cycles. In such examples, a basic ALD process cycle employs only the reactants to create the base film composition (e.g., $SiO_x$, or SiC, or SiCN). This basic process is performed in all or nearly all ALD cycles. However, some of the ALD cycles are executed as variant cycles and they deviate from the conditions of the normal deposition cycles. For example, they may employ one or more additional reactants. These variant cycles may also employ the same reactants employed in the basic ALD process, although this need not be the case.

Such ALD processes are particularly beneficial in preparing doped oxides or other doped materials as ALD films. In some implementations, dopant precursors are included as the "additional" reactant in only a small fraction of the ALD cycles. The frequency of adding the dopant is dictated by the desired concentration of dopant. For example, the dopant precursor may be included in every 10th cycle of the base material deposition.

Unlike many other deposition processes, some ALD processes may be conducted at a relatively low temperature. Generally, the ALD temperature will be between about 20 and 400° C. Such temperature may be chosen to permit deposition in the context of a temperature sensitive process such as deposition on a photoresist core. In a specific embodiment, a temperature of between about 20 and 100° C. is used for double patterning applications (using, e.g., photoresist cores). In another embodiment, a temperature of between about 200 and 350° C. is employed for memory fabrication processing.

As suggested above, ALD is well suited for depositing films in advanced technology nodes. Thus, for example, ALD processing may be integrated in processes at the 32 nm node, the 22 nm node, the 16 nm node, the 11 nm node, and beyond any of these. These nodes are described in the International Technology Roadmap for Semiconductors (ITRS), the industry consensus on microelectronic technology requirements for many years. Generally, they reference one-half pitch of a memory cell. In a specific example, the ALD processing is applied to "2X" devices (having device features in the realm of 20-29 nm) and beyond.

While most examples of ALD films presented herein concern silicon-based microelectronic devices, the films may also find application in other areas. Microelectronics or optoelectronics using non-silicon semiconductors such as GaAs and other III-V semiconductors, as well as II-VI materials such as HgCdTe may profit from using the ALD processes disclosed herein. Applications for conformal dielectric films in the solar energy field, such as photovoltaic devices, in the electrochromics field, and in other fields are possible.

ALD processes may be employed to deposit any of a number of different types of film. While most of the examples presented herein, concern dielectric materials, the disclosed ALD processes may be employed to form films of conductive and semiconductor materials as well. Silicon carbides, nitrides, and carbon-doped nitrides are featured dielectric materials.

SiC/SiCN Film Forming Cross-Metathesis Reactions Employing Organometallic Co-Reactants SiC/SiCN films—i.e., films comprising SiC, SiCN, and mixtures of SiC and SiCN—may be deposited onto semiconductor substrate surfaces via the various cross-metathesis reactions disclosed herein. The general nature of a cross-metathesis reaction was described above. As also indicated above, SiC/SiCN film-forming cross-metathesis reactions may involve the reaction of a organometallic ligand transfer reagent with a silicon-containing precursor to form various SiC/SiCN films.

Figures 2A, 2B:
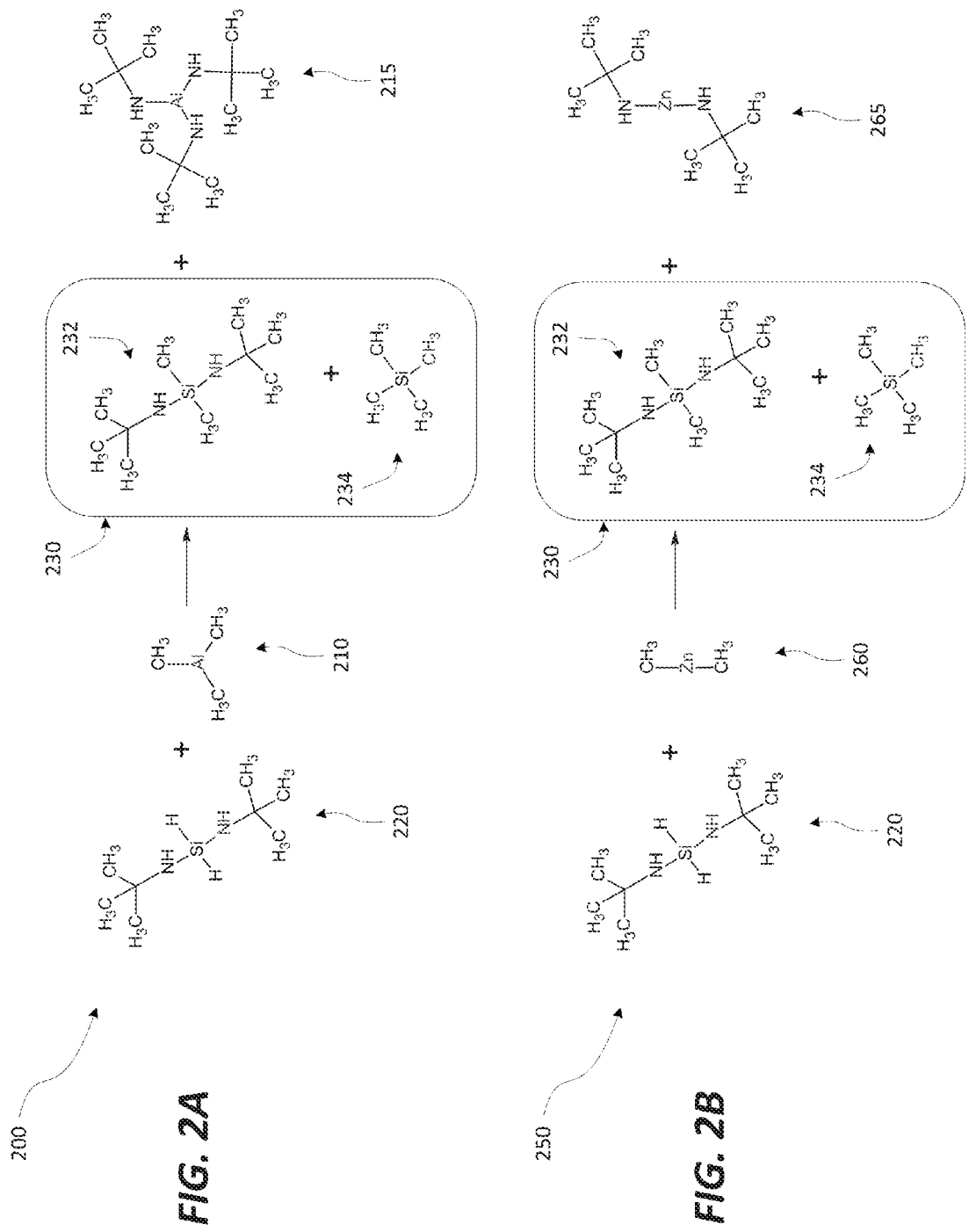
FIG. 2A schematically illustrates a SiC/SiCN film forming cross-metathesis reaction between a silicon-containing film precursor and the organometallic trimethylaluminum.
FIG. 2B schematically illustrates a SiC/SiCN film forming cross-metathesis reaction between a silicon-containing film precursor and the organometallic dimethylzinc.

FIGS. 2A and 2B illustrate two possible cross-metathesis reactions involving an organometallic ligand transfer reagent which results in the formation of a film composed of both SiC and SiCN species. FIG. 2A depicts the cross-metathesis reaction 200 of trimethylaluminum 210 with the silicon-containing film precursor BTBAS (bis-t-butylaminosilane) 220. FIG. 2B depicts the cross-metathesis reaction 250 of dimethylzinc 260 with the same silicon-containing BTBAS film precursor 220. Both cross-metathesis reactions 200, 250 result in the formation a film 230 comprised of a SiC-type reaction product 234, tetramethylsilane, and a SiCN-type reaction product 232, bis(tertiary-butylamino)dimethylsilane. (Note that in FIGS. 2A and 2B, the composition of the film 230 is designated schematically by the boxes surrounding the SiCN-type and SiC-type reaction products 232 and 234).

One feature of these reactions—as well as other similar reactions where the silicon-containing precursor possesses an amine functional group—is that the stoichiometric ratio of SiC to SiCN in the resulting deposited SiC/SiCN films is tunable. In some embodiments, it is feasible to adjust the stoichiometric ratio of SiC to SiCN in the deposited films by varying the relative amounts of organometallic ligand transfer reagent and silicon-containing precursor (in this case BTBAS) present in the reaction chamber when the film forming reactions occurs. In some embodiments, controlling the flow rate of one or more reactants to the processing chamber may provide a mechanism for adjusting the stoichiometric ratio of SiC to SiCN. For instance, the SiC content of a film may be increased relative to its SiCN content by increasing the flow rate of ligand transfer reagent to the processing chamber.

For example, referring again to FIG. 2A and reaction 200, increasing the flow rate of trimethyl aluminum 210 promotes the formation of tetramethylsilane 234 relative to bis(tertiary-butylamino)dimethylsilane 232 in reaction 200, thus causing a corresponding increase in the carbonization—essentially, the ratio of SiC to SiCN—in the deposited films. This is because while 1 equivalent of trimethylaluminum 210 will cause partial exchange/metathesis of the silicon-hydrogen bonds in the BTBAS film-precursor 220, something on the order of 10-100 equivalents of trimethylaluminum will start to poach the silicon-amine bonds of the BTBAS film-precursor 220 as well. In other words, a higher level of carbonization in the deposited film may be achieved by oversaturating the reaction chamber with the co-reactant that transfers the alkyl group—in this case, trimethylaluminum. Similarly, referring to FIG. 2B and reaction 250, oversaturating the reaction chamber with many equivalents of dimethylzinc 260, increasing its flow rate, etc. promotes the formation of tetramethylsilane 234, once again due to increased metathesis of BTBAS's silicon-amine bonds, which again results in an increased ratio of SiC to SiCN in the deposited film. Conceptually, but without being limited to a particular theory, the ability to modulate these ratios is a consequence of LeChatelier's Principle. Such control of film composition is useful because films of predominantly SiC species versus films of predominantly SiCN species will typically have differing physical, chemical, and/or electrical properties, and so by varying the stoichiometric ratios of SiC to SiCN, these physical, chemical, and/or electrical properties may be adjusted and engineered.

Reactions 200 and 250 depicted in FIGS. 2A and 2B may be employed in an ALD-type process (as described above) for forming SiC/SiCN films. In some cases, this results in the formation of conformal SiC/SiCN films—films which conform to the surface of a patterned substrate's three-dimensional features. Formation of these films via reactions 200 and/or 250 in an ALD-type process typically involves adsorption of the silicon-containing precursor—in these cases, BTBAS—onto the substrate surface prior to introduction of the organometallic ligand transfer reagent into the processing chamber. Without being limited to a particular theory, the conformal nature of the resulting film is generally thought to arise because only a limited quantity of BTBAS may be adsorbed onto the substrate surface at any one time—i.e., the surface becomes saturated—limiting the thickness of the resulting film and promoting the film's conformance to the contour/profile/3D-shape of the substrate surface. Of course, as described above in general reference to ALD processes, an ALD-formed film's thickness may be increased, while oftentimes maintaining its conformal character, by performing multiple cycles of ALD. In any event, after the substrate surface is saturated with silicon-containing precursor, the organometallic ligand transfer reagent (or agents)—in these cases, trimethylaluminum 210 for reaction 200 and dimethylzinc 260 for reaction 250—may be introduced into the processing chamber, which then reacts with the adsorbed BTBAS forming the SiC/SiCN film.

In view of the preceding disclosure relating generally to ALD-type processes, it should be readily understood to one of skill in the art that many variations and modifications of the foregoing ALD-scheme employing reactions 200 and 250 are feasible. For instance, in some embodiments, a pump-to-base and/or inert purge may be employed to eliminate unadsorbed silicon-containing precursor (e.g., BTBAS) from the processing chamber prior to introduction of organometallic ligand transfer reagent (e.g., trimethylaluminum, dimethylzinc) in order to prevent any gas-phase reactions of these species. However, such a pump-to-base or inert purge may not be required. As another example, in some cases, a plasma may be generated within the processing chamber in order to activate the reaction between the adsorbed silicon-containing precursor and the organometallic ligand transfer reagent, however, plasma-activation may not be required. For instance, reactions 200 and 250 do not require plasma activation, their kinetics being such that they are adequately driven by thermal energy, but plasma activation is not precluded either. Another example of a feature described above which may be employed with respect to these SiC/SiCN films is post-deposition plasma treatment. This may be used, for instance, to densify the as-deposited film (as described in greater detail below), improving its physical, chemical, and/or electrical properties. Other possible post-dep plasma treatments are described in detail above with respect to ALD processes, however, it should be understood that these post-dep treatments are optional and not required. Finally, note that although the foregoing ALD processes have been described in terms of the silicon-containing film precursor being first adsorbed onto the substrate surface to form an adsorption-limited layer prior to introduction of the organometallic ligand transfer reagent, some embodiments may reverse these roles and have the organometallic ligand transfer reagent adsorbed onto the substrate surface prior to introduction of the silicon-containing film precursor.

Referring once again to FIGS. 2A and 2B, in addition to forming the components of the SiC/SiCN film 230, there are also volatile species formed as byproducts of reactions 200 and 250. One aluminum containing byproduct species 215 is shown in FIG. 2A, and one zinc containing byproduct species 265 is shown in FIG. 2B, however there are other, albeit similar, byproduct species which may be formed via reactions 200 and 250. For instance, although volatile species 215 possesses three tert-butyl amine groups attached to its aluminum center, reaction 200 may form one or more other byproducts which have one or more of these amine groups substituted with a methyl group. Similarly, byproducts of reaction 250 could have one or both tert-butyl amine groups attached to the zinc center of byproduct 265 replaced with methyl groups. In any event, many process sequences for forming these films will contain one or more steps for removing these byproducts from the processing chamber.

Properties and Characteristics of Cross-Metathesis Formed SiC/SiCN Films

SiC/SiCN films formed using the cross-metathesis reactions disclosed herein comprise carbon, silicon, and nitrogen atoms formed into a solid matrix composed of partial SiN-type covalent bonds and partial SiC-type covalent bonds. Furthermore, as described above, the relative numbers of SiC-type and SiN-type bonds is tunable, adjustable, for example, by modulating the flow of organometallic ligand transfer reagent into the processing chamber during film formation. Thus, in some embodiments, there may be a roughly one-to-one mixture of SiC-type and SiN-type bonds—for example, if reactions 200 and 250 in FIGS. 2A and 2B are carried out under conditions strongly favoring the formation of bis(tertiary-butylamino)dimethylsilane 232. In other embodiments, a film may be predominantly composed of SiC-type bonds—for example, if reactions 200 and 250 are carried out under conditions strongly favoring the formation of tetramethylsilane 234. In still other embodiments, if an organometallic ligand transfer reagent having alkylamine function groups is employed, a film may be formed which consists predominantly of SiN-type bonds. Of course, by choosing reactants and reaction conditions appropriately, other ratios of SiC-type bond to SiN-type bond are feasible in the deposited films. Thus, in some embodiments, the ratio of SiC-type bond to SiN-type bond in the deposited film may be about 20:1, 10:1, 5:1, 4:1, 3:1, 2:1, 1:1, 1:2, 1:3, 1:4, 1:5, 1:10, or about 1:20, and in some embodiments, the ratio of SiC-type bond to SiN-type bond may fall within a range of ratios defined by any pair of the aforementioned ratios, such as, for example, a ratio of SiC-type bond to SiN-type bond between about 5:1 and about 1:3.

There may also be metal atoms present in the SiC/SiCN matrix due to the fact that an organometallic species was used in the film-forming metathesis reactions. For instance, if the film is formed via reaction 200 there may be aluminum present in the final SiC/SiCN film, and if reaction 250 is used, there may be zinc present. In some cases, presence of metal atoms is of no concern, however, in other cases, it may be advantageous to minimize or eliminate the presence of metals to the extent that it is feasible. Thus, in some embodiments, the latter may be accomplished by performing the metathesis reaction under conditions whereby incorporation of the metal atom from the organometallic into the deposited film is either thermodynamically or kinetically disfavored. For example, in some embodiments, process pressures, temperatures, RF power levels, silicon-containing film-precursor dose times and/or flow rates, organometallic ligand transfer reagent dose times and/or flow rates, RF times and/or levels, high-frequency RF frequency ranges, low-frequency RF frequency ranges, reactant purge times, product purge times, etc. may be adjusted alone or in combination to achieve conditions whereby incorporation of the metal atom into the deposited film is thermodynamically and/or kinetically disfavored. In some embodiments, a post-dep treatment may promote elimination of any incorporated metal atoms. In some embodiments, adjustment of reaction conditions in combination with one or more post-dep treatments may lead to lower concentrations of metal atoms in the deposited films. Thus, in some embodiments, the molar ratio of metal atom to silicon atom in a deposited SiC/SiCN film may be about 1:10,000,000, 1:1,000,000, 1:100,000, 1:10,000, 1:1000, 1:500, 1:200, 1:100, or about 1:50, and in some embodiments, the molar ratio may fall within a range of ratios defined by any pair of the aforementioned ratios, such as, for example, a molar ratio of metal to silicon of between about 1:1,000,000 and about 1:100,000.

Organometallic Ligand Transfer Reagents for Use in Cross-Metathesis Reactions to Form SiC/SiCN Films Organometallic ligand transfer reagents appropriate for use in a cross-metathesis reaction with a silicon-containing precursor are typically volatile compounds selected according to their ability to transfer either an alkyl group or an alkylamine functional group to the silicon atom of the silicon-containing precursor. In the case of alkyl group transfer, the organometallic ligand transfer reagent will typically have one or more alkyl groups bound to a central metal atom of moderate to weak electronegativity which, without being limited to a particular theory, results in at least one carbon atom of the one or more alkyl groups being nucleophilic enough to attack the somewhat electrophilic silicon atom of the silicon-containing precursor. Such organometallic compounds include various alkyl zinc compounds such as $ZnR_2$ where R is chosen from the Me (i.e., $-CH_3$), Et (i.e., $-CH_2CH_3$), i-Pr (i.e., $-CH(CH_3)_2$), n-Pr (i.e., $-CH_2CH_2CH_3$), and t-butyl (i.e., $-C(CH_3)_3$) functional groups. Other suitable organometallic compounds include various alkyl aluminum compounds and alkylmagnesium compounds, such as $AlR_3$ and RMgX, respectively, where R is chosen from the Me, Et, i-Pr, and n-Pr functional groups and X (in the case of RMgX) is chosen from F, Cl, Br, and I. In addition, bis(2-methoxyethoxy)aluminum-hydride (often referred to as "Red-Al") is yet another suitable organoaluminum compound. Also, it is important to note that while the letter 'R' is used here to designate an alkyl functional group, when more than one 'R' group is present in a single compound, it should be understood that the specific alkyl groups represented by the 'R' designations may be different. Thus, the group of compounds designed as $ZnR_2$ where R is selected from the Me, Et, i-Pr, n-Pr, and t-butyl functional groups, includes dimethylzinc and diethylzinc, as well as methylethylzinc, for example. In essence, $ZnR_2$ above could have been written RZnR' where R and R' are chosen from Me, Et, i-Pr, n-Pr, and t-butyl, but for sake of simplicity here and in what follows, the foregoing approach has been followed. Also, note that the presence of one or more other chemical species substituted onto an 'R' functional group is also contemplated by these examples, so long as the presence of the additional functional substituent(s) does not render inoperative the carbon-transfer functionality of the particular silicon-containing precursor being used.

Similarly, appropriate alkylamine transferring organometallic ligand transfer reagents, typically have one or more alkylamine groups bound to a central metal atom of moderate to weak electronegativity which, without being limited to a particular theory, results in at least one nitrogen atom of the one or more alkylamine groups being nucleophilic enough to attack the somewhat electrophilic silicon atom of the silicon-containing precursor. Such organometallic compounds include various alkylamine zinc compounds such as $Zn(NR_2)_2$ where R is chosen from the Me, Et, i-Pr, n-Pr, and t-butyl functional groups and, once again, it is to be noted that $Zn(NR_2)_2$ may possess different types of 'R' functional groups as described above. Other suitable alkylamine organometallic compounds include various alkylamine aluminum compounds such as $AlR(NR_2)_2$, or $Al(NR_2)_3$, or $AlR_2NR_2$, as well as various alkylamine magnesium compounds, such as $NR_2MgX$, where R is chosen from the Me, Et, i-Pr, n-Pr, and t-butyl functional groups and X (in the case of $NR_2MgX$) is chosen from F, Cl, Br, and I. Note, for example, that following the convention used herein, $Al(NR_2)_3$, may actually have 6 different types of alkyl groups attached to its 3 nitrogen atoms. Finally, note that in some cases, it may be appropriate to employ one of the alkylamine organometallic ligand transfer reagents described above, but wherein one of the alkyl R groups bound to a particular nitrogen atom has been replaced with a single hydrogen atom. The volatility of metathesis reaction byproducts may be another consideration which is influenced by the choice of organometallic agent—e.g. byproducts 215 and 265 in FIGS. 2A and 2B are sufficiently volatile to promote their removal from the processing chamber after film deposition.

Silicon-Containing Precursors for Use in Cross-Metathesis Reactions to Form SiC/SiCN Films A wide variety of silicon-containing precursors may be chosen for use in SiC/SiCN film-forming cross-metathesis reactions with organometallic ligand transfer reagents. The silicon-containing precursor will oftentimes contain just a single silicon atom, however, in principle, silicon-containing precursors with multiple silicon atoms are feasible for use as well (disilane ($Si_2H_6$), for example). The silicon atom (or atoms) are typically bonded to some combination of alkyl groups, amine groups, halogen atoms, and hydrogen atoms.

A silicon compound having its silicon atom(s) bonded to one or more alkyl groups and/or hydrogen atoms (but not amine or halogen groups) is referred to as a silane. Depending on the embodiment, the silicon atom(s) may be bonded to 4 alkyl groups, or 3 alkyl groups and a hydrogen, or 2 alkyl groups and 2 hydrogens, or 1 alkyl group and 3 hydrogens, or just to 4 hydrogens. Possible alkyl groups which may be selected include, but are not limited to, the Me, Et, i-Pr, n-Pr, and t-butyl functional groups. Silicon compounds having multiple silicon atoms, may have silicon atom bonded to silicon atom, reducing the number of other substituents on each by one—disilane ($Si_2H_6$), for example, has 3 hydrogens attached to each of its two silicons. Specific examples of silanes suitable for use as film-precursors include, but are not limited to, silane ($SiH_4$), disilane ($Si_2H_6$), methylsilane ($H_3SiCH_3$), ethylsilane, isopropylsilane, t-butylsilane, dimethylsilane ($H_2Si(CH_3)_2$), trimethylsilane ($HSi(CH_3)_3$), diethylsilane, di-t-butylsilane, allylsilane, sec-butylsilane, thexylsilane, isoamylsilane, t-butyldisilane, and di-t-butyldisilane.

A silicon compound having its silicon atom(s) bonded to one or more halogen atoms in addition to possibly alkyl groups and/or hydrogen atoms is referred to as an halosilane. Depending on the embodiment, the silicon atom(s) may be bonded to 4 halogen atoms, or 3 halogen atoms, or 2 halogen atoms, or 1 halogen atom. Iodosilanes, bromosilanes, chlorosilanes, and fluorosilanes may be suitable for use as film-precursors. Although halosilanes, particularly fluorosilanes, may form reactive halide species that can etch silicon materials, in certain embodiments described herein, the silicon-containing reactant is not present when a plasma is struck. Specific examples of chlorosilanes suitable for use as film-precursors include, but are not limited to, tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane ($SiHCH_3Cl_2$), chlorodimethylsilane, chloroethylsilane, t-butylchlorosilane, di-t-butylchlorosilane, chloroisopropylsilane, chloro-sec-butylsilane, t-butyldimethylchlorosilane, and ethyldimethylchlorosilane. Specific examples of iodosilanes, bromosilanes, and fluorosilanes include, but are not limited to, compounds similar in molecular structure to these chlorine containing compounds but having, in place of the chorine atom(s), either iodine, bromine, or fluorine atom(s), respectively. For instance, the bromosilane corresponding to trichlorosilane ($HSiCl_3$) is tribromosilane ($HSiBr_3$).

A silicon compound having its silicon atom(s) bonded to one or more amine groups in addition to possibly alkyl groups, hydrogen atoms, oxygen atoms, and/or halogen atoms is referred to as an aminosilane. Depending on the embodiment, the silicon atom(s) may be bonded to 4 amine groups, or 3 amine groups, or 2 amine groups, or 1 amine group. For instance, a particular film-precursor having 2 amine groups and 2 hydrogen atoms bonded to a central silicon atom is BTBAS 220 (bis-t-butylaminosilane, $SiH_2(NHC(CH_3)_3)_2$) as shown in FIGS. 2A and 2B. Other specific examples of aminosilanes suitable for use as film-precursors include, but are not limited to, mono-, di-, tri-, and tetra-aminosilane ($H_3SiNH_2$, $H_2Si(NH_2)_2$, $HSi(NH_2)_3$, and $Si(NH_2)_4$, respectively). Substituted mono-, di-, tri-, and tetra-aminosilanes may also serve as suitable film-precursors including, but not limited to, such compounds having their amine group substituted with the Me, Et, i-Pr, n-Pr, and t-butyl functional groups. Specific examples include t-butylaminosilane, methylaminosilane, t-butylsilanamine, n-tert-butyltrimethylsilylamine, t-butyl silylcarbamate, $SiHCH_3(N(CH_3)_2)_2$, $SiH(N(CH_3)_2)_3$, $SiHCl(N(CH_3)_2)_2$, $Si(CH_3)_2(NH_2)_2$, $(NR)_2Si(CH_3)_2$ (where R is either a hydrogen or is selected from the Me, Et, i-Pr, n-Pr, and t-butyl functional groups), and trisilylamine ($N(SiH_3)_3$).

Thermal Activation of SiC/SiCN Film Forming Cross-Metathesis Reactions

While the ALD processes described above, and in U.S. patent application Ser. No. 13/084,399, are generally plasma activated, it will be appreciated that, in many embodiments, such ALD processes may also be thermally activated. In fact, one advantage of employing organometallic ligand transfer reagents in cross-metathesis reactions for forming SiC/SiCN films is that, for many of these types of reactions, the thermodynamics and kinetics are such that the reactions may be thermally driven, foregoing the requirement that an activating plasma be formed in the process chamber. Of course, it should be appreciated that, in some embodiments, the ALD process described above and in U.S. patent application Ser. No. 13/084,399 may be activated by a non-thermal, non-plasma-related energy source, and that generally any method of activation may potentially be used within the scope of the present disclosure. For example, in some embodiments, ultraviolet (UV) radiation may serve as such a non-thermal, non-plasma-related energy source.

Plasma Activation of SiC/SiCN Film Forming Cross-Metathesis Reactions

Although, in some embodiments and in some circumstances, it is preferable to thermally drive the cross-metathesis reactions, in other embodiments or situations, plasma activation may still be preferred. For instance, in some embodiments, plasma activation of SiC/SiCN film deposition reactions may result in lower deposition temperatures than in thermally-activated reactions, potentially reducing consumption of the available thermal budget of an integrated process. For example, in some embodiments, a plasma-activated ALD process may even occur at room temperature.

The location of the plasma source may vary depending on the embodiment. In some embodiments, it may be preferable to use a downstream or a remote plasma source (i.e., generated outside of the main reaction chamber), an inductively-coupled plasma, and/or a microwave surface wave plasma. In other embodiments, the plasma may be ignited and formed directly above the substrate surface. This may provide a greater plasma density and enhanced surface reaction rate between reactants A and B. For example, plasmas for ALD processes may be generated by applying a radio frequency (RF) field to a low-pressure gas using two capacitively coupled plates.

Any suitable gas may be used to form the plasma. In a first example, and inert gas such as argon or helium may be used to form the plasma. In a second example, a reactant gas such as oxygen or ammonia may be used to form the plasma. In a third example, a sweep gas such as nitrogen may be used to form the plasma. Of course, combinations of these categories of gases may be employed. Ionization of the gas between the plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas for ALD processes may be formed by one or more suitable methods other than capacitive coupling of an RF field to a gas.

Post-Deposition Plasma Treatment of SiC/SiCN Films Deposited via Cross-Metathesis Reactions As explained more fully below, and as suggested in the discussion of feature 4 above, extending plasma exposure time and/or providing a plurality of plasma exposure phases may provide a post-deposition-reaction treatment of bulk and/or near-surface portions of the deposited film. In one scenario, decreasing surface contamination by post-dep plasma treatment may prepare the surface for adsorption of subsequent reactants/film-precursors and/or deposition of subsequent film layers. For example, in some embodiments, a layer of SiC/SiCN film formed via cross-metathesis reaction(s) may have a surface which resists adsorption of subsequent film-precursors. Plasma-treatment of such a surface may make hydrogen bond sites available for binding, facilitating subsequent adsorption and surface reaction events.

While certain embodiments include one instance of an ALD cycle including a plasma treatment phase, it will be appreciated that any suitable number of iterations may be employed within the scope of the present disclosure. Further, it will be appreciated that one or more plasma treatment cycles may be inserted at intervals (regular or otherwise) between normal ALD deposition cycles. It will be appreciated that any suitable number of ALD deposition cycles may precede or follow one or more plasma treatment cycles. For example, in a scenario where a plasma treatment is used to alter a film density, at least 50 or at least 25 or at least 15 or at least 10 or at least 5 or at least 4 or at least 3 or at least 2 ALD deposition cycles may be performed before or between plasma treatment cycles. In a scenario where a plasma treatment is used to prepare the surface of a SiC/SiCN film for further adsorption and surface reaction events, a plasma treatment phase may be incorporated in every ALD cycle, e.g., after each ALD deposition phase.

Plasma treatment of the deposited film may alter one or more physical and/or electrical characteristics of the film. In one scenario, a plasma treatment may densify a newly deposited film. Densified films may be more etch-resistant than non-densified films. In some embodiments, film properties, such as film stress, dielectric constant, refractive index, and/or etch rate may be adjusted by varying plasma parameters of the plasma used in post-dep treatment of a deposited film. Post-dep plasma treatment may also be used to vary the compressive or tensile stress characteristics of the deposited film. For example, extended plasma exposure times may increase a deposited film's compressive stress. Plasmas may also be used to remove contamination from the deposited films (e.g., hydrogen). In some embodiments, post-dep plasma treatment may be effective for lowering the concentration of metal atoms incorporated into the deposited film having been left over from the reaction of the silicon-containing film precursor with the organometallic ligand transfer reagent. It will be appreciated that modifying the concentrations of various contaminants may in turn modify the electrical and/or physical properties of the film. For example, modulation of carbon, nitrogen, hydrogen, silicon, and/or metal atom content may modulate a film's dielectric constant and/or a film etch rate. Certain post-dep plasma treatments, may additionally employ ultraviolet (UV) radiation to modulate the physical and/or electrical properties of the deposited film.

It is possible that, in some embodiments, untreated SiC/SiCN films may exhibit relatively poor electrical performance due to the possibility of fixed charge in the as-deposited film. This has been seen, for example, in untreated ALD-deposited oxide films, which, in some cases, have been found to exhibit significant within-wafer flat-band voltage ($V_{fb}$) variations. However, in some embodiments, post-dep treatment with UV-radiation and/or thermal anneal in the presence of hydrogen may help to alleviate such problems. For example, such treatments may passivate/alleviate defects related to fixed charge which are present (1) at the interface of the SiC/SiCN film with the underlying substrate, (2) within the deposited SiC/SiCN film itself, and/or (3) at the exposed surface of the SiC/SiCN film—i.e. dealing with the presence of surface charge. In some embodiments, using such treatments may help to significantly reduce the $V_{fb}$ spread of an as-deposited SiC/SiCN film.

Examples of post-dep treatments which may be applied in order to improve the physical and/or electrical properties and characteristics of ALD-formed SiC/SiCN films include, but are not limited to:

(A) Post-dep treatment of ALD-formed SiC/SiCN films with a UV cure, optionally followed by hydrogen-anneal, in order to reduce fixed charge.

(B) Substrate pre-treatment prior to SiC/SiCN film deposition using treatments such as, but not limited to: $H_2$-plasma, $N_2$-plasma, $N_2/H_2$-plasma, $NH_3$-plasma, Ar-plasma, He-plasma, He-anneal, $H_2$-anneal, $NH_3$-anneal, and UV cure in the presence of He, $H_2$, Ar, $N_2$, $H_2/N_2$-forming gas, $NH_3$. Plasma processing may be enabled with various plasma generators including, but not limited to, microwave, ICP-remote, direct, and the like.

(C) Concurrent treatment (curing during deposition) with treatments including, but not limited to: $H_2$-plasma, $N_2$-plasma, $N_2/H_2$-plasma, $NH_3$-plasma, Ar-plasma, He-plasma, He anneal, $H_2$-anneal, $NH_3$-anneal, and UV cure in the presence of He, $H_2$, Ar, $N_2$, $H_2/N_2$-forming gas, $NH_3$. Plasma processing may be implemented with various plasma generators including, though not limited to, microwave, ICP-remote, direct, and others known to those in the art. Isotropic and directional processing may be applied including, but not limited to, remote plasma, UV exposure, direct plasma, and microwave plasma. In some embodiments, films may be treated intermittently between groups of ALD cycles. A group of ALD cycles may vary from between about 1-10 cycles, or about 10-100 cycles, or about 100-1000 cycles, or about 1000-10,000 cycles. A typical scenario includes: (1) 5 cycles of ALD film growth followed by (2) one or more film treatments with any of the methods described above (e.g., He-plasma, UV-treatment), followed by (3) 5 cycles of ALD film growth. In some embodiments, such a method may be used to grow a film of any desired thickness.

(D) UV treatment imparted as a byproduct by any of the plasmas listed above which may emit UV radiation under the right conditions (e.g., a helium plasma emits UV radiation). For example, one specific procedure for in situ UV "cure" involving plasma treatment during ALD cycling involves the following operations: (1) UV treatment via He-plasma; (2) BTBAS dose and adsorption onto the substrate surface to form an adsorption-limited layer; (3) Purge; (4) dose with TMA (trimethylaluminum) and its reaction with adsorbed BTBAS; (5) Purge; and (6) Repeat steps 1-5 to yield a SiC/SiCN film of the desired thickness.

A range of UV cure conditions may be employed in any of the listed contexts. Generally, the temperature of the substrate holder (e.g., pedestal) will be maintained between about 250° C. and about 500° C. during the cure. For many device fabrication applications, the upper temperature will be limited to about 450° C. or even to about 400° C. The atmosphere employed during the cure may be inert or reactive. Examples of gases that may be present during the cure include helium, argon, nitrogen, forming gas, and ammonia. The flow rate of such gases may be about 2 to 20,000 sccm, preferably about 4000 to 18,000 sccm. The power of the UV lamp may, for example, be between about 2 and 10 kW, and preferably between about 3.5 and 7 kW. An appropriate duration of exposure to UV from such source is between about 20 and 200 seconds, or between about 50 and 100 seconds, e.g., about 90 seconds. Finally, the pressure may be held at a level between about 0 and 40 Torr. The physical and electrical characteristics of the deposited film may also be altered by adjusting other process parameters, such as deposition temperature.

Applications of SiC and SiCN Films

Films of SiC and/or SiCN formed via the cross-metathesis reactions disclosed herein may have a variety of applications in semiconductor processing. Conformal SiC/SiCN films may be useful for step coverage and feature fill applications in ~10 nm memory and 12/7 nm generation logic nodes. Other applications of SiC/SiCN-based conformal films include, but are not limited to, low-k films (k approximately 3.0 or lower, in some examples) for back-end-of-line (BEOL) interconnect isolation applications, conformal SiCN films for etch stop and spacer layer applications, conformal antireflective layers, and copper adhesion and barrier layers. Many different compositions of low-k dielectrics for BEOL processing can be fabricated using SiC/SiCN films prepared via ALD processes. Additional applications exist for etch stop layers, low wet-etch rate spacers, and otherwise hermetic and conformal layers. It should also be appreciated, however, that for some applications of SiC/SiCN films, the degree to which the SiC/SiCN film is characterizable as conformal may not be critical.

It should also be appreciated that while multiple layers of SiC/SiCN film having substantially the same composition may be formed via sequential cycles of deposition (whether by CVD or ALD), in some embodiments sequentially deposited SiC/SiCN films may have differing compositions. For instance, the carbonization level of two sequentially deposited layers of SiC/SiCN film may be different—i.e. the ratios of SiC bonds to SiN bonds may be different in each layer. In some embodiments, a first layer may be characterized as predominantly a SiC-type film and a second layer formed atop of it may be characterized as predominantly a SiCN-type film, or vice versa. In some embodiments, several layers of SiC/SiCN film having a common first composition may be deposited via sequential deposition cycles followed by the sequential deposition of several layers of SiC/SiCN film having a common second composition. In other words, at some point in a sequence of multiple deposition cycles, the composition of the deposited film may be modified. For instance, in some embodiments, 1, or 2, or 3, or 4, or 5, or 6-10, or 11-25, or 26-50 sequential layers of SiC/SiCN film having such a first composition, are alternated with 1, or 2, or 3, or 4, or 5, or 6-10, or 11-25, or 26-50 sequential layers of SiC/SiCN film having such a second composition to form a SiC/SiCN film stack having groups of layers of alternating composition. In some embodiments, a third, or a third and a fourth composition may be cycled through as well. Of course, layers of other types of films may also be interspersed between the SiC/SiCN film layers, depending on the embodiment and the particular application of the embodiment. Thus, 1, or 2, or 3, or 4, or 5, or 6-10, or 11-25, or 26-50 sequential layers of another film type may be alternated with 1, or 2, or 3, or 4, or 5, or 6-10, or 11-25, or 26-50 sequential layers of a SiC/SiCN film to form a film stack having groups of layers alternating between SiC/SiCN film and the other film type. For example, a double spacer for a gate device may be fabricated by in-situ deposition of a silicon nitride/silicon oxide spacer stack.

Apparatuses for Depositing SiC/SiCN Films

Figure 3:
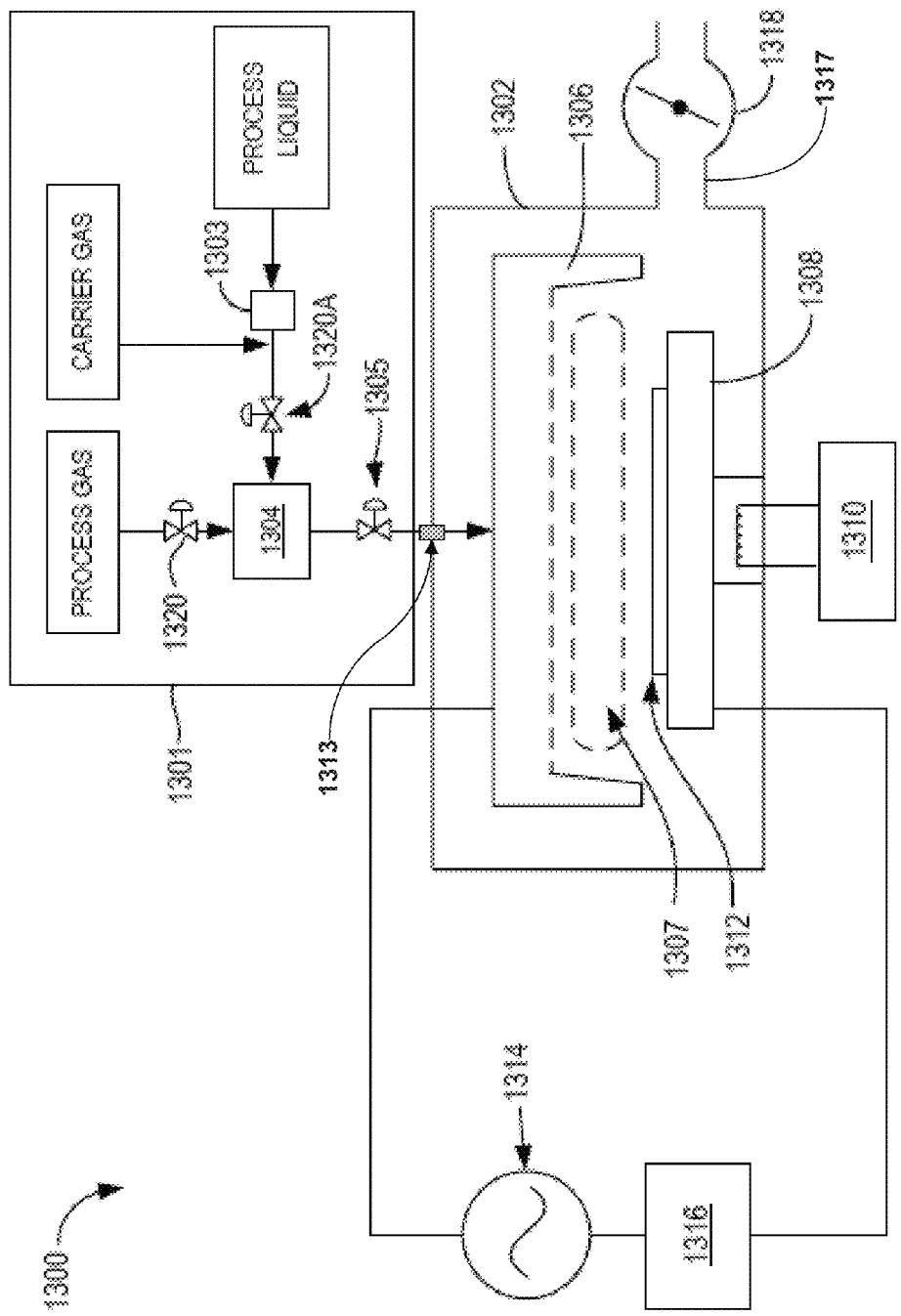
FIG. 3 is a schematic of a semiconductor processing apparatus for forming SiC/SiCN films illustrating a processing chamber, one process station, and a reactant delivery system.
Figure 4:
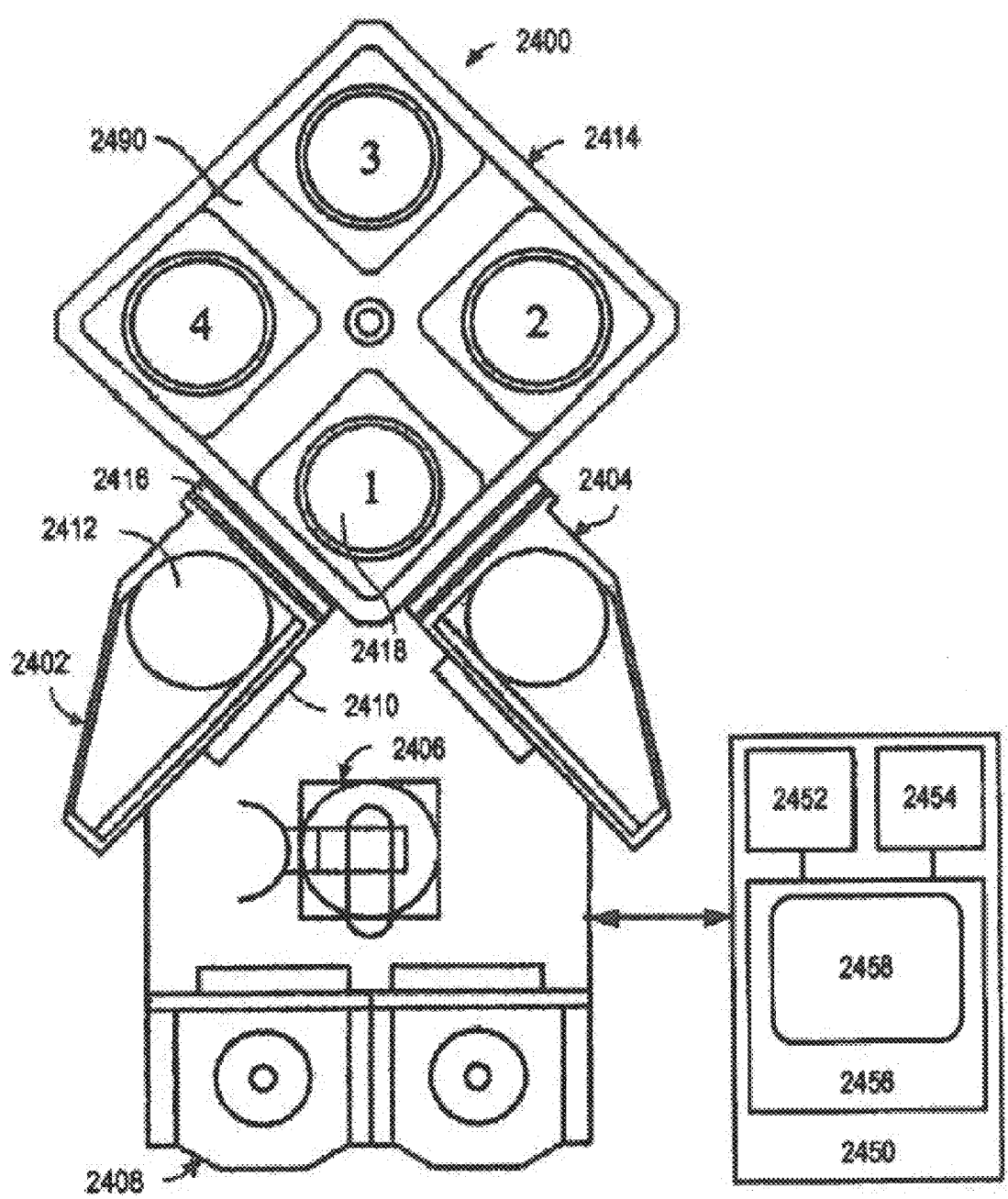
FIG. 4 is a schematic of a semiconductor processing apparatus for forming SiC/SiCN films having a processing chamber, four process stations, an inbound load lock, an outbound load lock, a robot for loading semiconductor substrates, a semiconductor substrate handling system, and a system controller.

It will be appreciated that any suitable process station may be employed for depositing SiC/SiCN films according to one or more of the embodiments described above. For example, FIG. 3 schematically shows an embodiment of an ALD process station 1300. For simplicity, ALD process station 1300 is depicted as a standalone process station having a processing chamber 1302 for maintaining a low-pressure environment. However, it will be appreciated that a plurality of ALD process stations 1300 may be included in a common low-pressure process tool environment. While the embodiment depicted in FIG. 3 shows one process station, it will be appreciated that, in some embodiments, a plurality of process stations may be included in a processing tool. For example, FIG. 4 depicts an embodiment of a multi-station processing tool 2400 having 4 process stations 2418 within a single processing chamber 2414. Further, it will be appreciated that, in some embodiments, one or more hardware parameters of ALD process station 1300, including those discussed in detail below, may be adjusted programmatically by one or more system controllers.

ALD process station 1300 provides that processing chamber 1302 is in fluidic communication, via one or more gas inlets 1313, with reactant delivery system 1301 which prepares and delivers process gases to the distribution showerhead 1306 within processing chamber 1302. Reactant delivery system 1301 includes a mixing vessel 1304 for blending and/or conditioning process gases prior to delivery to showerhead 1306, and one or more valves 1305 for controlling the amount of gas flowing through gas inlet 1313. One or more mixing vessel inlet valves 1320, 1320A may control introduction of process gases to mixing vessel 1304.

Some reactants, like BTBAS, may be stored in liquid form prior to vaporization at and subsequent delivery to the process station. For example, the embodiment of FIG. 3 includes a vaporization point 1303 for vaporizing liquid reactant to be supplied to mixing vessel 1304. In some embodiments, vaporization point 1303 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 1303 may be heat traced. In some examples, mixing vessel 1304 may also be heat traced. In one non-limiting example, piping downstream of vaporization point 1303 has an increasing temperature profile extending from approximately 100 degrees Celsius to approximately 150 degrees Celsius at mixing vessel 1304.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 1303. In one scenario, a liquid injector may be mounted directly to mixing vessel 1304. In another scenario, a liquid injector may be mounted directly to showerhead 1306.

In some embodiments, a showerhead 1306 and a substrate holder such as a pedestal 1308 may electrically communicate with an RF power supply 1314 and matching network 1316 for powering a plasma. In some embodiments, the plasma energy may be controlled by controlling one or more of a process station pressure, a gas concentration, an RF source power, an RF source frequency, and a plasma power pulse timing. For example, RF power supply 1314 and matching network 1316 may be operated at any suitable power to form a plasma having a desired composition of radical species. Examples of suitable powers include, but are not limited to, powers between 100 W and 5000 W for a 300 mm wafer. Likewise, RF power supply 1314 may provide RF power of any suitable frequency. In some embodiments, RF power supply 1314 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions, or for post-dep plasma treatment of the as-deposited SiC/SiCN films. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, a semiconductor substrate holder such as pedestal 1308 may be temperature controlled via a heater 1310. Further, in some embodiments, pressure control for processing chamber 1302 may be provided by butterfly valve 1318 which controls gas flow through gas outlet 1317. As shown in the embodiment of FIG. 3, butterfly valve 1318 throttles a vacuum provided by a downstream vacuum pump (not shown). However, in some embodiments, pressure control of processing chamber 1302 may also be adjusted by varying the flow rate of one or more gases introduced to processing chamber 1302, for instance, through gas inlet 1313. In some embodiments, the downstream vacuum pump may be used to evacuate reaction byproducts from processing chamber 1302 through gas outlet 1317 such as, for example, chemical byproducts constituting or containing metal atoms left over after the reaction of organometallic compounds to form SiC/SiCN films.

As mentioned above, one or more process stations may be included in a multi-station processing tool. FIG. 4 shows a schematic view of an embodiment of a multi-station processing tool 2400 having 4 processing stations 2418 (labeled 1-4) within a single processing chamber 2414. To provide access to the processing chamber 2414, processing tool 2400 has an inbound load lock 2402 and an outbound load lock 2404, either or both of which may comprise a remote plasma source. A robot 2406, at atmospheric pressure, is configured to move wafers from a cassette loaded through a pod 2408 into inbound load lock 2402 via an atmospheric port 2410. A wafer is placed by the robot 2406 on a pedestal 2412 in the inbound load lock 2402, the atmospheric port 2410 is closed, and the load lock is pumped down. Where the inbound load lock 2402 comprises a remote plasma source, the wafer may be exposed to a remote plasma treatment in the load lock prior to being introduced into a processing chamber 2414. Further, the wafer also may be heated in the inbound load lock 2402, for example, to remove moisture and adsorbed gases. Next, a chamber transport port 2416 to processing chamber 2414 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

Each of the 4 process stations 2418 shown in FIG. 4 may have a heated pedestal, as well as one or more gas inlets. It will be appreciated that, in some embodiments, each process station 2418 may have different or multiple purposes. For example, in some embodiments, a process station may be switchable between a ALD SiC/SiCN film forming process mode and an ALD mode for forming some other type of film. In some embodiments, a process station may be switchable between an ALD process mode and a PECVD (plasma enhanced chemical vapor deposition) process mode. Additionally or alternatively, in some embodiments, processing chamber 2414 may include one or more matched pairs of ALD and PECVD process stations. While the processing chamber 2414 depicted in FIG. 4 comprises 4 process stations 2418, it will be understood that a processing chamber according to the present disclosure may have any suitable number of stations. For example, in some embodiments, a processing chamber may have five or more stations, while in other embodiments a processing chamber may have three or fewer stations. And, it is noted that the processing chamber 1302 depicted in FIG. 3 has just one process station.

FIG. 4 also depicts an embodiment of a wafer handling system 2490 for transferring wafers within processing chamber 2414. In some embodiments, wafer handling system 2490 may transfer wafers between various process stations 2418 and/or between a process station and a load lock. It will be appreciated that any suitable wafer handling system may be employed. Non-limiting examples include wafer carousels and wafer handling robots.

FIG. 4 also depicts an embodiment of a system controller 2450 having machine readable code with instructions for controlling process conditions and hardware states of process tool 2400 and operating various components of process tool 2400. System controller 2450 may include one or more memory devices 2456, one or more mass storage devices 2454, and one or more processors 2452. Processor 2452 may include a CPU or computer, analog and/or digital input/output connections, stepper motor controller boards, etc. System controller 2450 may execute on processor 2452 machine readable code 2458 loaded into memory device 2456 from mass storage device 2454.

In some embodiments, system controller 2450 has instructions in the form of machine readable code for operating and controlling all of the activities of process tool 2400. In some embodiments, system controller 2450 has instructions in the form of machine readable code for implementing the above-described SiC/SiCN film deposition processes. These instructions may include instructions for controlling the timing, mixture of gases, chamber and/or station pressure, chamber and/or station temperature, wafer temperature, target power levels, RF power levels, DC power levels, substrate pedestal, chuck and/or susceptor position, and any other parameters of a particular process performed by process tool

2400. For instance, in some embodiments, the machine readable code 2458 may include instructions for operating a reactant delivery system, such as reactant delivery system 1301 in FIG. 3. These instructions may include instructions for introducing a silicon-containing film precursor into the processing chamber so that the silicon-containing film precursor adsorbs onto a surface of the substrate under conditions whereby the silicon-containing film precursor forms an adsorption-limited layer. These instructions may also include instructions for operating the reactant delivery system to introduce an organometallic ligand transfer reagent into the processing chamber so that the organometallic ligand transfer reagent reacts with the adsorbed silicon-containing film precursor to form a film layer and a byproduct which contains substantially all of the metal of the ligand transfer reagent. In some embodiments, machine readable code 2458 may include instructions for operating the one or more gas outlets (for example, 1317 in FIG. 3) to evacuate one or more reaction byproducts from a processing chamber (for example, 2414 in FIG. 4).

Machine readable code 2458 for operating and controlling process tool 2400 may be configured in any suitable way. For example, various process tool component subroutines or control objects may be written to control operation of the process tool components necessary to carry out various process tool processes. Machine readable code 2458 may be written/coded in any suitable computer readable programming language.

In some embodiments, machine readable code 2458 for operating and controlling process tool 2400 may include input/output control (IOC) sequencing instructions for controlling the various parameters described above. For example, each phase of an ALD process may include one or more instructions for execution by system controller 2450. The instructions for setting process conditions for an ALD process phase may be included in a corresponding ALD recipe phase. In some embodiments, the ALD recipe phases may be sequentially arranged, so that all instructions for an ALD process phase are executed concurrently with that process phase.

Other machine readable code stored on mass storage device 2454 and/or memory device 2456 associated with system controller 2450 may be employed in some embodiments. Examples of such machine readable code may include programs or sections of programs such as a substrate positioning program, a process gas control program, a pressure control program, a heater control program, and a plasma control program.

A substrate positioning program may include machine readable code for process tool components that are used to load the semiconductor substrate onto pedestal 2418 and to control the spacing between the substrate and other parts of process tool 2400.

A process gas control program may include machine readable code for controlling gas composition and flow rates and optionally for flowing gas into one or more process stations prior to deposition in order to stabilize the pressure in the process station. A pressure control program may include machine readable code for controlling the pressure in the process station by regulating, for example, a throttle valve in the exhaust system of the process station, a gas flow into the process station, etc.

A heater control program may include machine readable code for controlling the current to a heating unit that is used to heat the substrate. Alternatively, the heater control program may control delivery of a heat transfer gas (such as helium) to the substrate.

A plasma control program may include machine readable code for setting RF power levels applied to the process electrodes in one or more process stations.

In some embodiments, there may be computer software and/or programs which provide a user interface associated with system controller 2450. The user interface may include a display screen, graphical software displays of the apparatus and/or process conditions. The user interface may be configured to accept input from various pointing devices (e.g., mice), keyboards, touch screens, touchpads, microphones, etc. In some embodiments, a user may operate the user interface in order to enter a recipe of process parameters/conditions (either by manually entering parameters, loading from a file, etc.) which are read and executed by the system controller 2450. Such recipes may include, but are not limited to, process gas composition, process gas flow rates, temperature, pressure, plasma conditions (such as RF bias power levels), pressure, temperature, etc.

Signals for monitoring the ALD processes may be provided by analog and/or digital input connections of system controller 2450 from various process tool sensors. The signals for controlling the process may be output on the analog and/or digital output connections of process tool 2400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or X-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Other Embodiments

Although the foregoing disclosed processes, methods, systems, apparatuses, and compositions have been described in detail within the context of specific embodiments for the purpose of promoting clarity and understanding, it will be apparent to one of ordinary skill in the art that there are many alternative ways of implementing these processes, methods, systems, apparatuses, and compositions which are within the spirit of this disclosure. Accordingly, the embodiments described herein are to be viewed as illustrative of the disclosed inventive concepts rather than restrictively, and are not to be used as an impermissible basis for unduly limiting the scope of the appended Claims.

I claim:

1. A method of forming a SiC/SiCN film layer on a surface of a semiconductor substrate in a processing chamber, the method comprising:

introducing a silicon-containing film-precursor into the processing chamber;

introducing an organometallic ligand transfer reagent into the processing chamber, wherein the organometallic ligand transfer reagent is a metal alkylamine compound that does not contain a halogen atom;

adsorbing the silicon-containing film-precursor, the organometallic ligand transfer reagent, or both onto the surface under conditions whereby either or both form an adsorption-limited layer;

reacting the silicon-containing film-precursor with the organometallic ligand transfer reagent, after either or both have formed the adsorption-limited layer, to form the film layer and a byproduct which contains substantially all of the metal of the organometallic ligand transfer reagent; and removing the byproduct from the processing chamber.

2. The method of claim 1, wherein the SiC/SiCN film layer is a conformal film layer.

3. The method of claim 2, wherein the surface of the substrate upon which the film is formed has patterned three-dimensional features.

4. The method of claim 1, wherein the silicon-containing film-precursor is a silane which does not contain a halogen atom.

5. The method of claim 4, wherein the silane comprises an alkyl group selected from the methyl, ethyl, propyl, and t-butyl functional groups.

6. The method of claim 5, wherein the silane comprises two alkyl groups selected from the methyl, ethyl, propyl, and t-butyl functional groups.

7. The method of claim 5, wherein the silane is selected from methylsilane, ethylsilane, isopropylsilane, t-butylsilane, dimethylsilane, trimethylsilane, diethylsilane, di-t-butylsilane, allylsilane, sec-butylsilane, thexylsilane, isoamylsilane, t-butyldisilane, and di-t-butyldisilane.

8. The method of claim 4, wherein the silane comprises a first amine group.

9. The method of claim 8, wherein the silane further comprises a second amine group, and wherein the first amine group is substituted with an alkyl group and the second amine group is substituted with an alkyl group.

10. The method of claim 8, wherein the silane is selected from mono-aminosilane, di-aminosilane, tri-aminosilane, tetra-aminosilane, t-butylaminosilane, methylaminosilane, t-butylsilanamine, n-tert-butyltrimethylsilylamine, t-butyl silylcarbamate, $SiHCH_3(N(CH_3)_2)_2$, $SiH(N(CH_3)_2)_3$, $SiHCl(N(CH_3)_2)_2$, $Si(CH_3)_2(NH_2)_2$, $N(SiH_3)_3$, and $(NR)_2Si(CH_3)_2$ where R is selected from H, Me, Et, i-Pr, n-Pr, and t-butyl.

11. The method of claim 1, wherein the silicon-containing film-precursor forms the adsorption-limited layer prior to introducing the organometallic ligand transfer reagent into the processing chamber.

12. The method of claim 1, wherein the organometallic ligand transfer reagent forms the adsorption-limited layer prior to introducing the silicon-containing film-precursor into the processing chamber.

13. The method of claim 1, wherein the alkyl groups of the metal alkylamine compound are selected from the methyl, ethyl, propyl, and t-butyl functional groups.

14. A semiconductor processing apparatus for forming a SiC/SiCN film layer on a surface of a semiconductor substrate, the apparatus comprising:

a processing chamber having a substrate holder within the chamber;

a reactant delivery system fluidically connected to the processing chamber;

one or more vacuum pumps;

one or more gas outlets fluidically connecting the processing chamber to the one or more vacuum pumps; and a system controller comprising a non-transitory machine readable medium comprising machine readable code, the code comprising:

instructions for operating the reactant delivery system to introduce a silicon-containing film-precursor into the processing chamber so that the silicon-containing film-precursor adsorbs onto a surface of the substrate under conditions whereby the silicon-containing film-precursor forms an adsorption-limited layer;

instructions for operating the reactant delivery system to introduce an organometallic ligand transfer reagent into the processing chamber, wherein the organometallic ligand transfer reagent is a metal alkylamine compound that does not contain a halogen atom, and wherein the organometallic ligand transfer reagent is introduced so that it reacts with the adsorbed silicon-containing film-precursor to form a film layer and a byproduct which contains substantially all of the metal; and instructions for operating the one or more gas outlets to evacuate the byproduct from the processing chamber.

15. The apparatus of claim 14, wherein the SiC/SiCN film layer is a conformal film layer.

16. The apparatus of claim 15, wherein the surface of the substrate upon which the film is formed has patterned three-dimensional features.

17. The apparatus of claim 14, wherein the silicon-containing film-precursor is a silane which does not contain a halogen atom.

18. The apparatus of claim 17, wherein the silane comprises an alkyl group selected from the methyl, ethyl, propyl, and t-butyl functional groups.

19. The apparatus of claim 18, wherein the silane comprises two alkyl groups selected from the methyl, ethyl, propyl, and t-butyl functional groups.

20. The apparatus of claim 18, wherein the silane is selected from methylsilane, ethylsilane, isopropylsilane, t-butylsilane, dimethylsilane, trimethylsilane, diethylsilane, di-t-butylsilane, allylsilane, sec-butylsilane, thexylsilane, isoamylsilane, t-butyldisilane, and di-t-butyldisilane.

21. The apparatus of claim 17, wherein the silane comprises a first amine group.

22. The apparatus of claim 21, wherein the silane further comprises a second amine group, and wherein the first amine group is substituted with an alkyl group and the second amine group is substituted with an alkyl group.

23. The apparatus of claim 14, wherein the silicon-containing film-precursor forms the adsorption-limited layer prior to introducing the organometallic ligand transfer reagent into the processing chamber.

24. The apparatus of claim 14, wherein the organometallic ligand transfer reagent forms the adsorption-limited layer prior to introducing the silicon-containing film-precursor into the processing chamber.

25. The apparatus of claim 14, wherein the alkyl groups of the metal alkylamine compound are selected from the methyl, ethyl, propyl, and t-butyl functional groups.

* * * * *